(12) United States Patent
Dosluoglu et al.

(10) Patent No.: US 7,423,302 B2
(45) Date of Patent: Sep. 9, 2008

(54) PINNED PHOTODIODE (PPD) PIXEL WITH HIGH SHUTTER REJECTION RATIO FOR SNAPSHOT OPERATING CMOS SENSOR

(75) Inventors: Taner Dosluoglu, New York, NY (US); Guang Yang, Annandale, NJ (US)

(73) Assignee: Digital Imaging Systems GmbH, Kirchheim/Teck-Nabern (DE)

( * ) Notice: Subject to any disclaimer, the term of this patent is extended or adjusted under 35 U.S.C. 154(b) by 52 days.

(21) Appl. No.: 11/284,300

(22) Filed: Nov. 21, 2005

(65) Prior Publication Data

US 2007/0114629 A1 May 24, 2007

(51) Int. Cl.
H01L 31/062 (2006.01)
H01L 31/113 (2006.01)

(52) U.S. Cl. .............. 257/233; 257/292; 257/294; 257/E33.076; 257/E31.121; 257/E31.122; 257/E27.133; 257/E27.134

(58) Field of Classification Search ............ None
See application file for complete search history.

(56) References Cited

U.S. PATENT DOCUMENTS

| | | | | |
|---|---|---|---|---|
| 5,514,887 | A * | 5/1996 | Hokari ............. | 257/222 |
| 6,136,629 | A * | 10/2000 | Sin ................. | 438/48 |
| 6,218,691 | B1 | 4/2001 | Chung et al. ....... | 257/290 |
| 6,326,230 | B1 | 12/2001 | Pain et al. ......... | 438/57 |
| 6,521,920 | B2 | 2/2003 | Abe ................. | 257/223 |
| 6,713,796 | B1 * | 3/2004 | Fox ................. | 257/292 |
| 6,737,626 | B1 | 5/2004 | Bidermann et al. ... | 250/208.1 |
| 6,885,047 | B2 | 4/2005 | Shinohara et al. ... | 257/292 |
| 2002/0047086 | A1 | 4/2002 | Pain ................ | 250/208.1 |
| 2004/0212031 | A1 * | 10/2004 | Yato ................ | 257/462 |
| 2004/0222449 | A1 * | 11/2004 | Koyama .............. | 257/292 |
| 2005/0224844 | A1 * | 10/2005 | Mizuguchi .......... | 257/233 |
| 2006/0267053 | A1 * | 11/2006 | Yang et al. ......... | 257/291 |
| 2007/0084986 | A1 * | 4/2007 | Yang et al. ......... | 250/208.1 |

(Continued)

OTHER PUBLICATIONS

Ozaki et al. A High-Packing Density Pixel With Punchthrough Read-Out Method for an HDTV Interline CCD. Jul. 1994, IEEE Transactions on Electron Devices. vol. 41, No. 7. pp. 1128-1135.*

(Continued)

*Primary Examiner*—Andy Huynh
*Assistant Examiner*—Hoang-Quan Ho
(74) *Attorney, Agent, or Firm*—Saile Ackerman LLC; Stephen B. Ackerman; Billy Knowles

(57) ABSTRACT

A pixel image sensor has a high shutter rejection ratio that prevents substrate charge leakage to a floating diffusion storage node of the pixel image sensor and prevents generation of photoelectrons within the floating diffusion storage node and storage node control transistor switches of the pixel image sensor. The pixel image sensor that prevents substrate charge leakage of photoelectrons from pixel image sensor adjacent to the pixel image sensor. The pixel image sensor is fabricated on a substrate with an isolation barrier and a carrier conduction well. The isolation barrier formed underneath the floating diffusion storage node allows effective isolation by draining away the stray carriers and preventing them from reaching the floating diffusion storage node. The carrier conduction well in combination with the deep N-well isolation barrier separates the pinned photodiode region from the deep N-well isolation barrier that is underneath the floating diffusion storage node.

27 Claims, 25 Drawing Sheets

U.S. PATENT DOCUMENTS

2007/0131992 A1* 6/2007 Dosluoglu et al. .......... 257/292

OTHER PUBLICATIONS

"A Snap-Shot CMOS Active Pixel Imager for Low-Noise, High-Speed Imaging", by Guang Young et al., Tech. Dig., Int'l Electron Devices Mtg., Dec. 1998, pp. 45-48.

"A Numerical Analysis of a CMOS Image Sensor With a Simple Fixed-Pattern-Noise Reduction Technology", by Kazuya Yonemoto et al, IEEE Trans. On Elec. Devices, vol. 49, No. 5, May 2002, pp. 746-753.

* cited by examiner

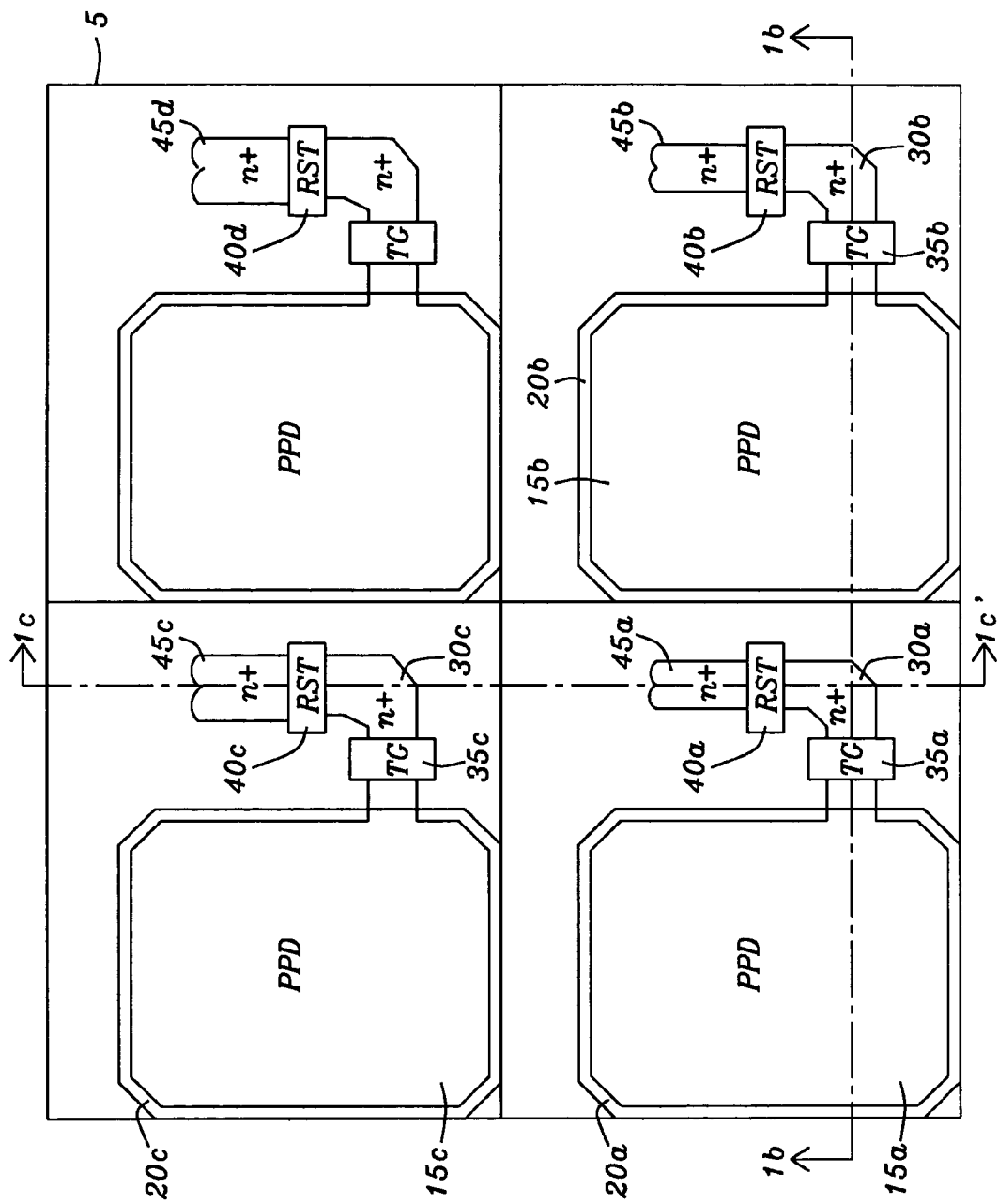
FIG. 1a – Prior Art

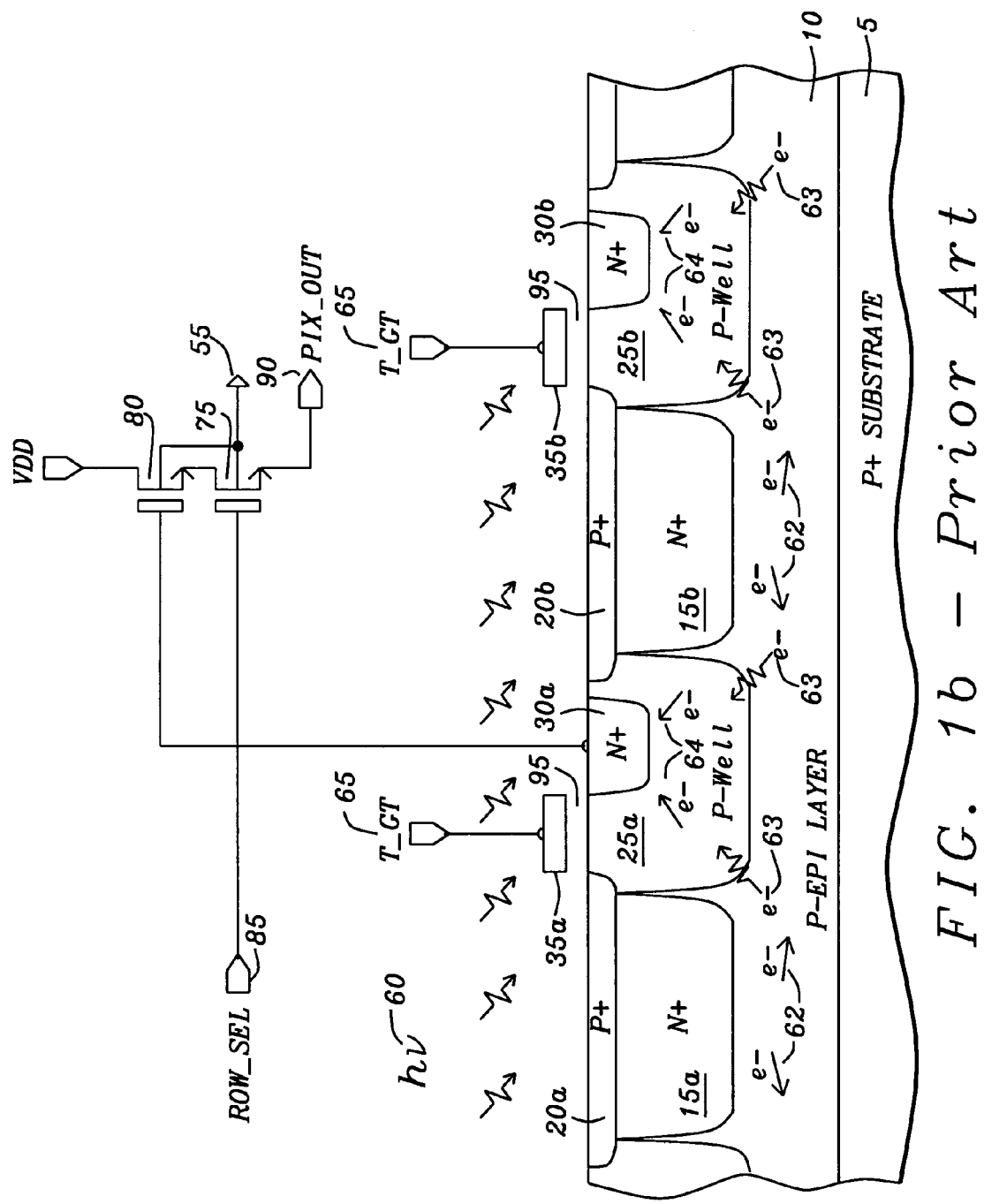
FIG. 1b – Prior Art

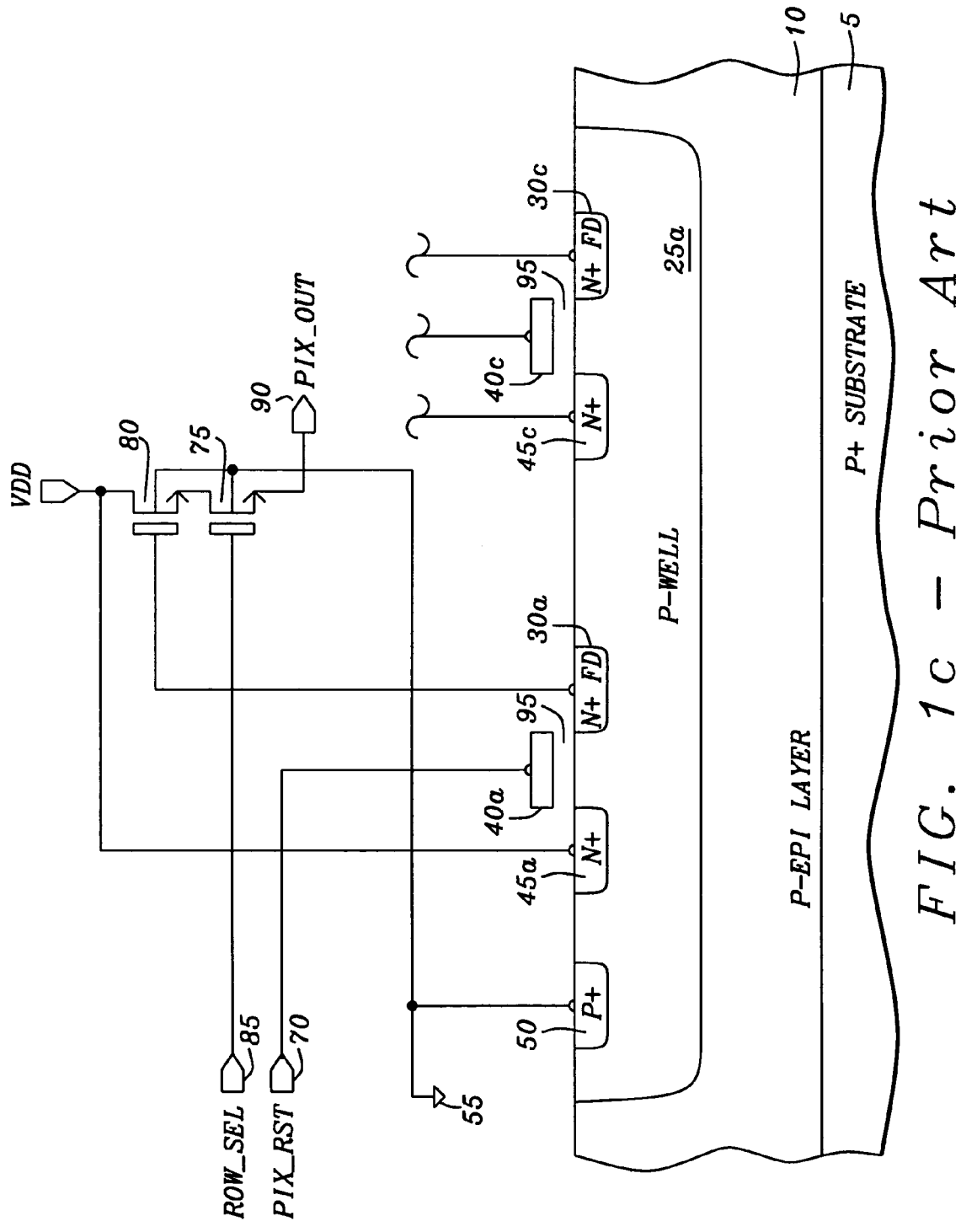
FIG. 1c – Prior Art

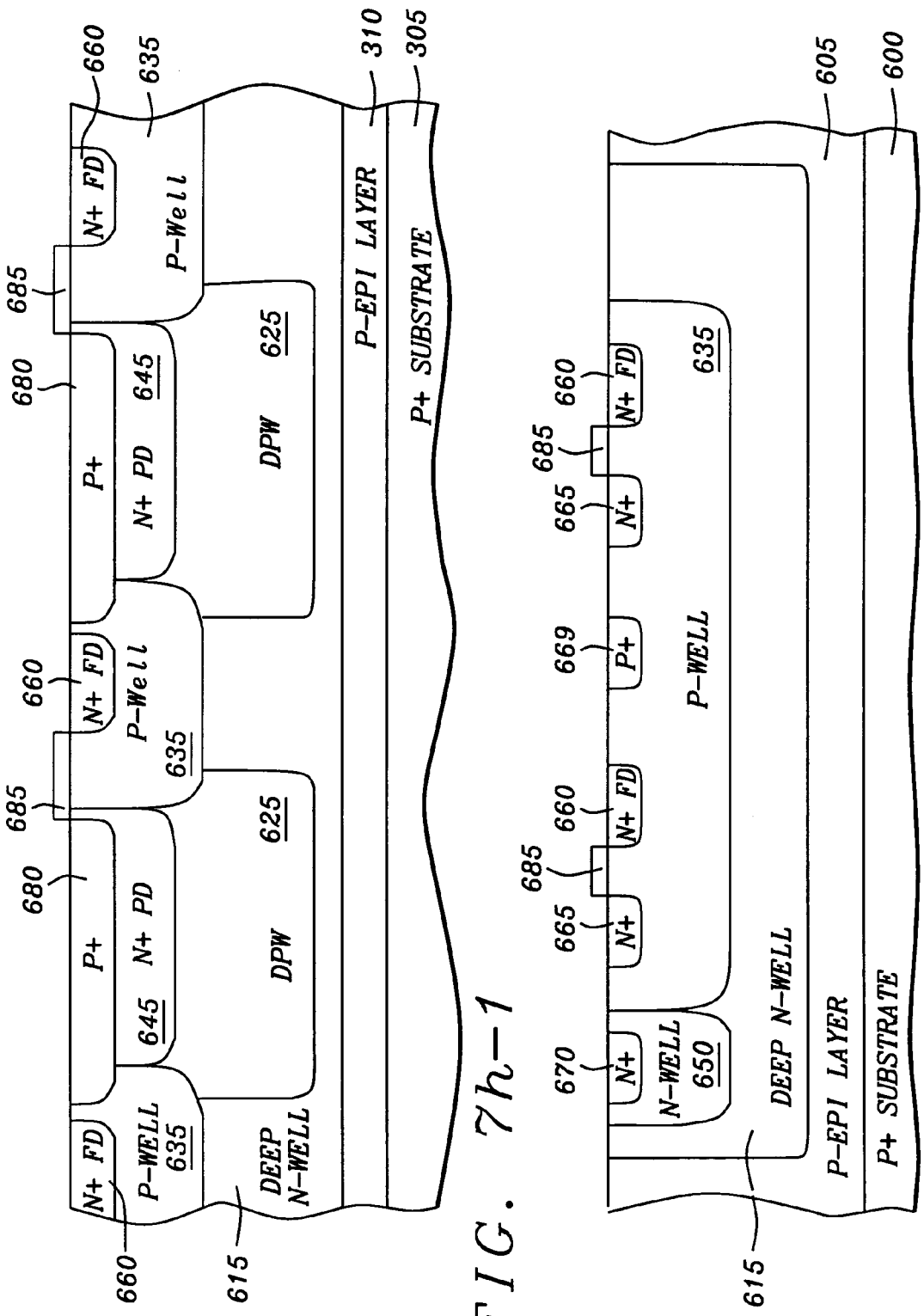

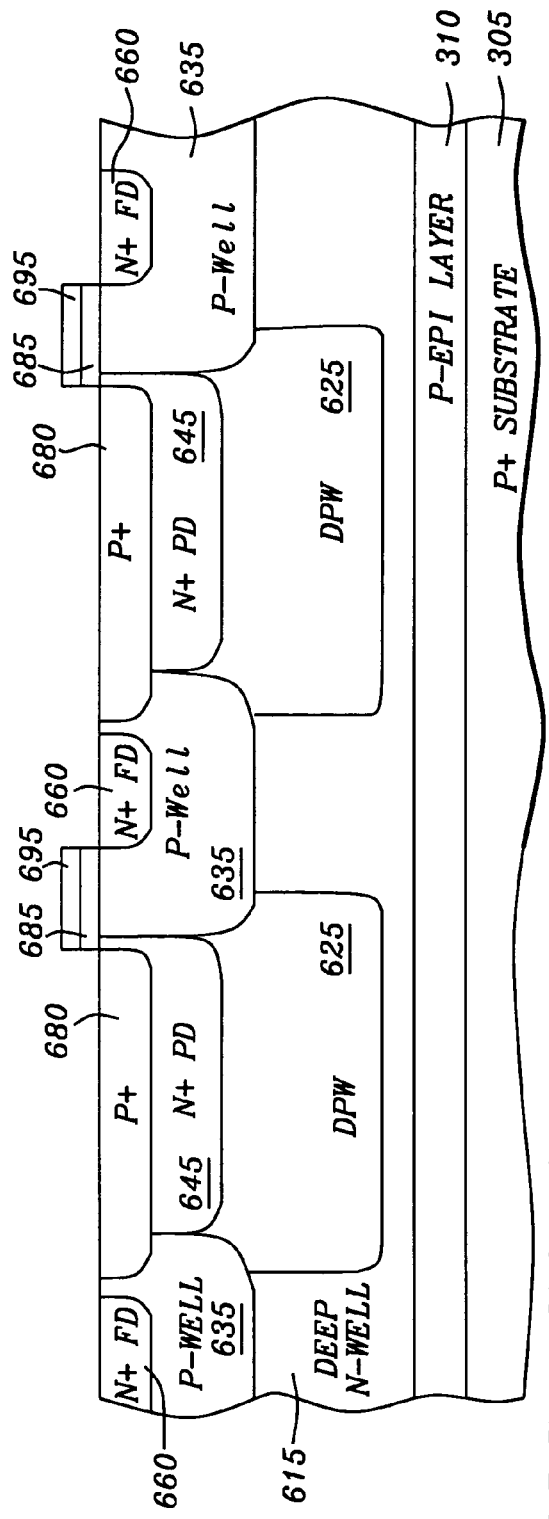
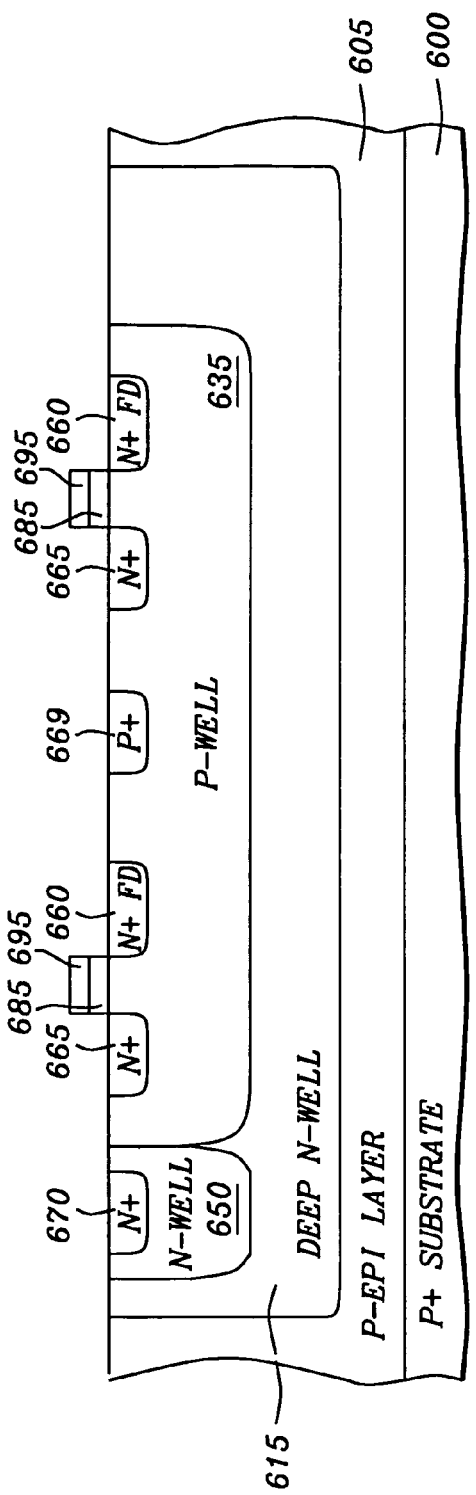
FIG. 7i-1
FIG. 7i-2

PINNED PHOTODIODE (PPD) PIXEL WITH HIGH SHUTTER REJECTION RATIO FOR SNAPSHOT OPERATING CMOS SENSOR

BACKGROUND OF THE INVENTION

1. Field of the Invention

The present invention relates to solid-state image sensing devices, methods for fabricating solid state image sensing devices and an image capture system using the same.

2. Description of Related Art

Integrated circuit image sensors are finding applications in a wide variety of fields, including machine vision, robotics, guidance and navigation, automotive applications, and consumer products such as digital camera and video recorders. Imaging circuits typically include a two dimensional array of photo sensors. Each photo sensor includes one picture element (pixel) of the image. Light energy emitted or reflected from an object impinges upon the array of photo sensors. The light energy is converted by the photo sensors to an electrical signal. Imaging circuitry scans the individual photo sensors to readout the electrical signals. The electrical signals of the image are processed by external circuitry for subsequent display.

Modern metal oxide semiconductor (MOS) design and processing techniques have been developed that provide for the capture of light as charge and the transporting of that charge within active pixel sensors and other structures so as to be accomplished with almost perfect efficiency and accuracy.

One class of solid-state image sensors includes an array of active pixel sensors (APS). An APS is a light sensing device with sensing circuitry inside each pixel. Each active pixel sensor includes a sensing element formed in a semiconductor substrate and capable of converting photons of light into electronic signals. As the photons of light strike the surface of a photoactive region of the solid-state image sensors, free charge carriers are generated and collected. Once collected the charge carriers, often referred to as charge packets or photoelectrons are transferred to output circuitry for processing.

An active pixel sensor also includes one or more active transistors within the pixel itself. The active transistors amplify and buffer the signals generated by the light sensing element to convert the photoelectron to an electronic signal prior to transferring the signal to a common conductor that conducts the signals to an output node.

Active pixel sensor devices are fabricated using processes that are consistent with complementary metal oxide semiconductor (CMOS) processes. Using standard CMOS processes allows many signal processing functions and operation controls to be integrated with an array of active pixel sensors on a single integrated circuit chip.

Refer now to FIGS. 1a-1c for a more detailed discussion of a pinned photo diode active pixel image sensor of the prior art. A substrate 5 heavily doped with a P-type impurity has its surface further doped with a complementary impurity to create a lightly doped P-type epitaxial layer 10. A P-type material is diffused into the surface of the substrate 5 to form the contact diffusions 50 within the P-well diffusion 25a to provide contact of the P-well diffusion 26a to the ground reference voltage. An N-type material is heavily diffused into the surface of the epitaxial layer 10 of the substrate 5 to form the $N^+$ photo diode depletion regions 15a, 15b, and 15c. A P-type material is heavily diffused relatively deeply into the surface of the epitaxial layer 10 of the substrate 5 to form the P-well diffusions 25a and 25b. A P-type material is heavily diffused relatively shallow into the surface of the epitaxial layer 10 of the substrate 5 to form the P-type pinning diffusions 20a and 20b. The P-type pinning diffusions 20a, 20b, and 20c encompass the surface of the $N^+$ photo diode depletion regions 15a, 15b, and 15c and overlap into the surface of the P-well diffusions 25a and 25b. The pinned photodiodes of the image sensors of the illustrate pixels are the $N^+$ photo diode depletion regions 15a, 15b, and 15c and the P-type pinning diffusions 20a, 20b, and 20c respectively.

A gate insulator or thin oxide 95 is placed on the surface of the substrate 5 at appropriate locations above the P-well diffusions 25a, 25b and 25c and polycrystalline silicon is formed on the surface of the thin oxide 95 to form the transfer gates 35a, 35b, and 35c and the reset gates 40a, 40b, and 40c. An N-type material is heavily diffused into the surface of the P-well diffusions 25a and 25b of the substrate 5 to form the floating diffusions 30a, 30b, and 30c and the $N^+$ source/drain regions 45a, 45b, and 45c. The $N^+$ photo diode depletion regions 15a, 15b, and 15c, the transfer gates 35a, 35b, and 35c, and the floating diffusions 30a, 30b, and 30c are a transfer gate switches. The floating diffusions 30a, 30b, and 30c, reset gates 40a, 40b, and 40c and $N^+$ source/drain regions 45a, 45b, and 45c form the reset gate switch.

The transfer gates 35a, 35b, and 35c of the transfer gate switches are connected to a transfer gating signals T_GT 65 and the reset gates 40a, 40b, and 40c of the reset gate switches are connected to the pixel reset signal PIX_RST 70. The $N^+$ source/drain regions 45a, 45b, and 45c are connected to a power supply voltage source VDD. The floating diffusion 30a is connected to the gate of the N-type metal oxide semiconductor (NMOS) transistor 80. The drain of the NMOS transistor 80 is connected to the power supply voltage source VDD and the emitter of the NMOS transistor 80 is connected to the drain of the NMOS transistor 75. The gate of the NMOS transistor 75 is connected to the row select signal 85. The NMOS transistor 75 acts as a source follower to buffer the electrical signal created by the photoelectron charge collected in the floating diffusion 30a.

The P-type pinning diffusions 20a, 20b, and 20c act rather like a self-biased, internal photogate. The doping levels and implant depths must be carefully controlled to deplete the $N^+$ photo diode depletion regions 15a, 15b, and 15c fully to ensure effective charge transfer from the diode to the floating diffusion. The P-type pinning diffusions 20a, 20b, and 20c pin the potential at the surface to that of the substrate or the ground reference voltage. $N^+$ photo diode depletion regions 15a, 15b, and 15c can tailored such that the depletion region is at the correct depth for efficient optical absorption. The $N^+$ photo diode depletion regions 15a, 15b, and 15c do not have to be so large and the dark current can thus be reduced. The photons that impinge upon the pinned photodiode formed of the P-type pinning diffusion 20a, the $N^+$ photo diode depletion region 15a, and the epitaxial layer 10 are converted to photoelectrons and collected in the $N^+$ photo diode depletion region 15a. At the completion of an integration of the collection of the photoelectrons, the floating diffusion 30a is reset by pulsing the reset gates 40a and then the transfer gate 35a is activated to turn on the transfer gate switch to transfer the collected photoelectrons to the storage node of the floating diffusion 30a. When the collected photoelectrons are retained at the floating diffusion 30a the row select signal 85 is activated to turn on the transistor 75 to gate the pixel output electrical signal PIX_OUT 90 to external circuitry for processing and display. The amplitude of pixel output electrical signal PIX_OUT 90 is indicative of the intensity of the light energy hv or the number of photons 60 absorbed by the pinned photodiode. Once the pixel output electrical signal PIX_OUT 90 is read out the pixel reset signal 70 is activated to turn on the reset gate switch and the N+ photo diode sensor region 15a and the floating diffusion storage node 30a are emptied of the photoelectrons.

As structured, some of the light energy hν 60 impinges upon the transfer gate switch and the reset gate switch and are converted to stray photoelectrons that collect in the floating diffusion storage node 30a. Some of the photoelectrons 62 are generated within the P-type epitaxial layer 10 and have some probability of drifting to the P-well diffusions 25a and 25b. The photoelectrons 63 that drift into the P-well diffusions 25a and 25b then drift to the floating diffusion storage nodes 30a, 30b, and 30c as the photoelectrons 64. The stray photoelectrons 64 then cause noise currents that interfere with the detection of the correct values of light intensity and cause distortion such as blooming and smearing of the image.

Active pixel sensor arrays may be operated in a read-reset mode with a row at a time being read out. This technique has minimum integration time to collect the photons and minimum time for generating a frame, however it may have motion artifacts due to non-simultaneous exposure.

A second type of operation of a CMOS active pixel sensor array is a block access mode. A block of pixels adjacent pixels are readout. This too has minimum integration time for a full block read out. Control for this type of read out is complicated Typically, a CMOS active pixel sensor array is operated in a rolling shutter mode in which each row of the array is exposed at different instants of time. The non-simultaneous exposure of the pixels can lead to image distortion, for example, when there is relative motion between the imager and the image that is to be captured. Furthermore, although the exposure time generally is defined by the duration for which the pinned photodiode is exposed to the impinging light, floating diffusion regions can continue to collect photoelectrons even after the exposure has terminated. Transfer of such unwanted charges into the sense node can result in image distortion and excess noise. Furthermore, the distortions tend to become more pronounced as the exposure time is reduced.

An alternative to the rolling shutter mode of operation is the snapshot mode with single simultaneous conversion of the photons to the photoelectrons and transfer of the photoelectrons to the floating diffusion storage node. Each pixel is read out one at-a-time readout. Since all pixels are exposed essentially simultaneously, the motion artifact is minimized. However, relatively long integration times (10 msec) precludes the capture of high velocity moving objects without blurring or the motion artifact.

"A Snap-Shot CMOS Active Pixel Imager for Low-Noise, High-Speed Imaging", Yang, et al., Technical Digest., International Electron Devices Meeting, December 1998, pp.: 45-48, presents the design and performance of a 128×128 snap-shot imager implemented in a standard single-poly CMOS technology. The pixel design and clocking scheme allows the imager to provide high-quality images without motion artifacts at high shutter speeds (<75 μsec, exposure), with low noise (<5 e−), immeasurable image lag, and excellent blooming protection.

"A Numerical Analysis of a CMOS Image Sensor with a Simple Fixed-Pattern-Noise-Reduction Technology", Yonemoto, et al., IEEE Transactions on Electron Devices, May 2002. Vol. 49, Issue 5, pp.: 746-753, describes a CMOS image sensor with a five-transistor pixel circuit with an L-shaped readout gate for a pinned photodiode and is adequate for rapid charge transfer.

U.S. Pat. No. 6,218,691 Chung, et al. provides an image sensor, including a deep N-region formed on a substrate with a P-type epitaxial region formed within the N-region. An active pixel sensor with a pinned diode is formed within the P-type epitaxial region. A P-well is formed in the P-type epitaxial region and contains the drive and select output transistors for the sensor.

U.S. Pat. No. 6,326,230 (Pain, et al.) describes high speed CMOS imager with motion artifact suppression and anti-blooming. Each pixel of the CMOS imager includes a photoactive region in the semiconductor substrate, a sense node, and a power supply node. A transfer gate is disposed above the surface of the semiconductor substrate. A bias signal applied to the transfer gate sets a potential in a region of the semiconductor substrate between the photoactive region and the sense node for transfer of photoelectrons to the sense node. A reset gate is disposed near the surface of the semiconductor substrate between the photoactive region and the power supply node. A reset signal on the reset gate sets a potential in a region of the semiconductor substrate between the photoactive region and the power supply node for clearing the photoelectrons from the photoactive region after read out of the electrical signal of an image without passing through the sense node.

U.S. Pat. No. 6,521,920 (Abe) provides a solid state image sensor with a primary first-conductivity-type semiconductive region which serves as a charge storage region of a photo-sensing area and a secondary first-conductivity-type semiconductive region for enlarging a charge collecting region of the photo-sensing area.

U.S. Pat. No. 6,737,626 (Bidermann, et al.) teaches an integrated image sensor having a conditioned top silicon oxide layer and/or one or more additional insulating layers/structures to reduce optical and/or electrical noise. The image sensor has one or more insulating structures formed on the substrate and configured to inhibit the flow of electricity between a photoelement and its associated circuitry and/or the pixel and an adjacent pixel in the array.

U.S. Pat. No. 6,885,047 (Shinohara, et al.) describes a solid-state image sensing device. Each pixel of the image sensing device has a photodiode, a first transistor, and a second transistor. A potential barrier is provided under the drain region of the first transistor and the source region and/or the drain region of the second transistor.

U.S. Patent Application 2002/0047086 (Pain) provides a leakage compensated snapshot imager that prevents smear and other problems in a snapshot imager. The area where the imager is formed may be biased in a way that prevents photo carriers including electrons and holes from reaching a storage area.

SUMMARY OF THE INVENTION

An object of this invention is to provide a pixel image sensor that has a high shutter rejection ratio.

Another object of this invention is to provide a pixel image sensor that prevents substrate charge leakage to a floating diffusion storage node of the pixel image sensor.

Further, another object of this invention is to provide a pixel image sensor that prevents generation of photoelectrons within the floating diffusion storage node and storage node control transistor switches of the pixel image sensor;

Even further, another object of this invention is to provide a pixel image sensor that prevents substrate charge leakage of photoelectrons from pixel image sensor adjacent to the pixel image sensor.

To accomplish at least one of these objects, a pixel image sensor is fabricated on a substrate. An isolation barrier is placed at a relatively great depth from a surface of the substrate and beneath a floating diffusion storage node and storage node control transistor switches of the pixel image sensor to prevent substrate charge leakage caused by photoelectrons generated in the substrate beneath a photon sensing area of the pixel image sensor from drifting to the storage node. A diffusion well is placed in the surface of the substrate to contact the isolation barrier and connected to a first biasing voltage to channel the photoelectrons away from the storage node. A carrier conduction well is placed at the relatively great depth and adjoining the isolation barrier to channel the substrate charge leakage to the isolation barrier. The carrier conduction well contains a photo sensing region of the pixel image sensor. The photo sensing region of the pixel image sensor is a pinned photodiode that is formed within the carrier conduction well.

A metal shield is fabricated above the storage node and storage node control transistor switches to prevent light from impinging on the storage node and storage node control transistor switches. The metal shield prevents generation of photoelectrons at the storage node and storage node control transistor switches. In the preferred embodiment, the metal shield is a combination of interconnecting wiring, interlayer vias, and substrate contact metallurgy placed above the storage node and storage node control transistor switches.

A metallic silicide is optionally placed in contact with the storage node and source/drain regions of the storage node control transistor switches. The metallic silicide layer being opaque, prevents light impinging on the storage node and storage node control transistor switches from generation of photoelectrons at the storage node and storage node control transistor switches.

The first biasing voltage is the power supply voltage source. The voltage of the power supply voltage source as connected to the isolation barrier, drains the photoelectrons that drift toward the isolation barrier. The second biasing voltage is a ground reference voltage source. The ground reference voltage source connected to the carrier conduction well minimizes the photoelectrons within the carrier conduction well.

The pixel image sensor is fabricated in an epitaxial layer of the substrate. The epitaxial layer being doped with an impurity of a first conductivity type. The isolation barrier is formed from diffusion of an impurity of a second conductivity type to the relatively great depth and the carrier conduction well being formed from diffusion of an impurity of the first conductivity type within the epitaxial layer. An isolation well is fabricated by diffusion of the impurity of the first type to a depth less than the relatively great depth on the isolation barrier and contains the storage node and storage node control transistor switches.

BRIEF DESCRIPTION OF THE DRAWINGS

FIGS. 1a-1c are a top plan view and cross sectional views of a pinned photodiode CMOS active pixel image sensor of the prior art.

FIGS. 7a-7k are cross sectional views of a substrate in the process of fabrication of a snapshot pinned photodiode CMOS active pixel sensor of this invention.

DETAILED DESCRIPTION OF THE INVENTION

Camera systems that are intended for capturing fast moving images require arrays of snapshot CMOS active pixel image sensors with an ultra high light shutter rejection ratio for detecting moving objects without motion artifacts. Light leakage to the storage node must be minimized to provide snapshot images without motion artifacts.

Figure 2:
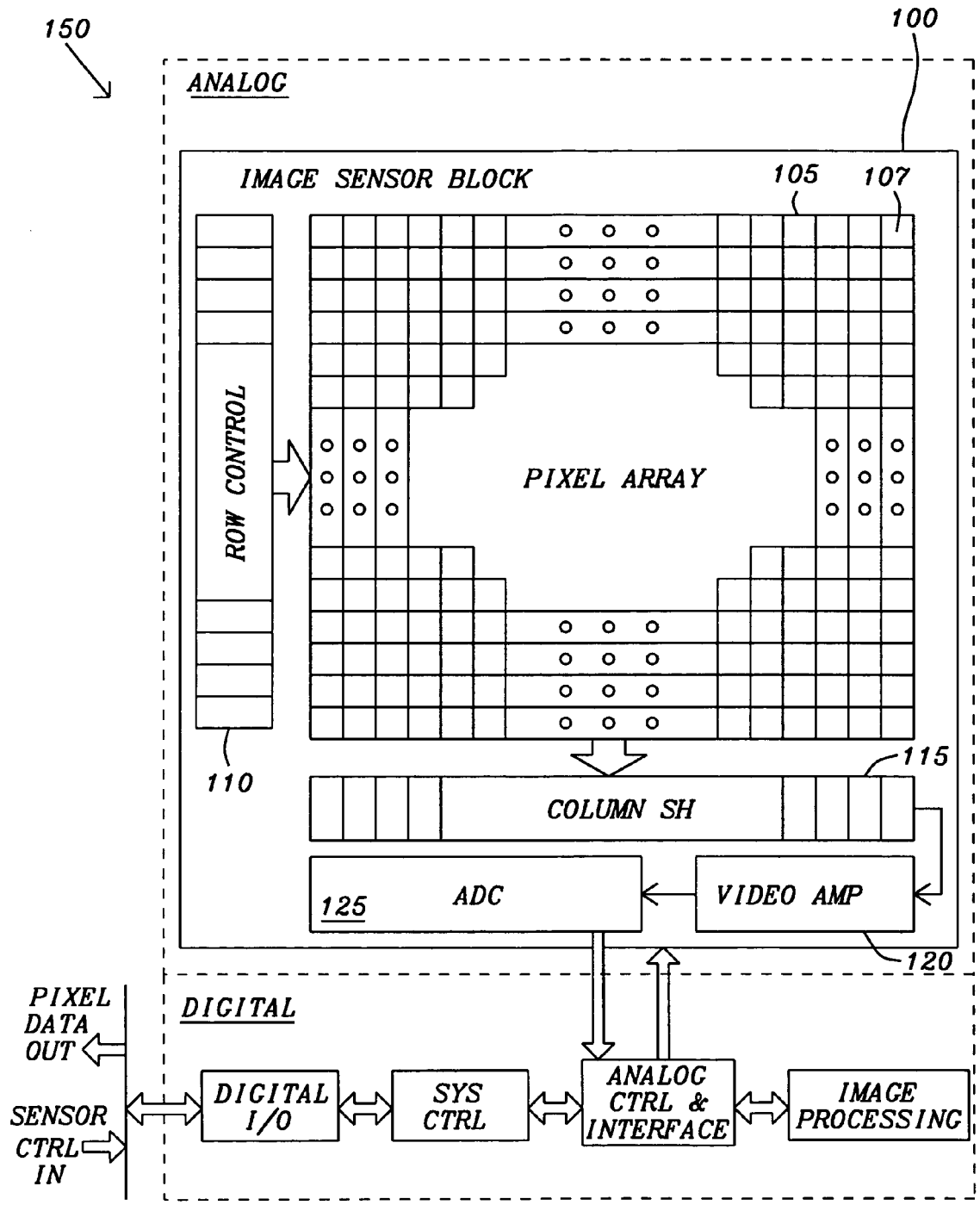
FIG. 2 is a diagram of an image processing application specific integrated circuit containing an array of snapshot pinned photodiode CMOS active pixel image sensors.

Refer to FIG. 2 for a discussion of an image processing application specific integrated circuit 150. The image processing application specific integrated circuit contains an image sensor 100. The image sensor 100 has an array 105 of snapshot pinned photodiode CMOS active pixel image sensors, row control circuitry 110, column sample and hold circuitry 115, a video amplifier 120, and an analog-to-digital converter 125.

The image processing application specific integrated circuit 150 has pinned photodiode active pixel image sensor array 105 with a few rows of dark pixels for auto offset correction. In the particular intended application as a camera system, the image processing application specific integrated circuit 150 the background illumination is expected to vary several orders of magnitude. Thus, snapshot operation of image sensor with minimum charge leakage is required.

Figure 3:
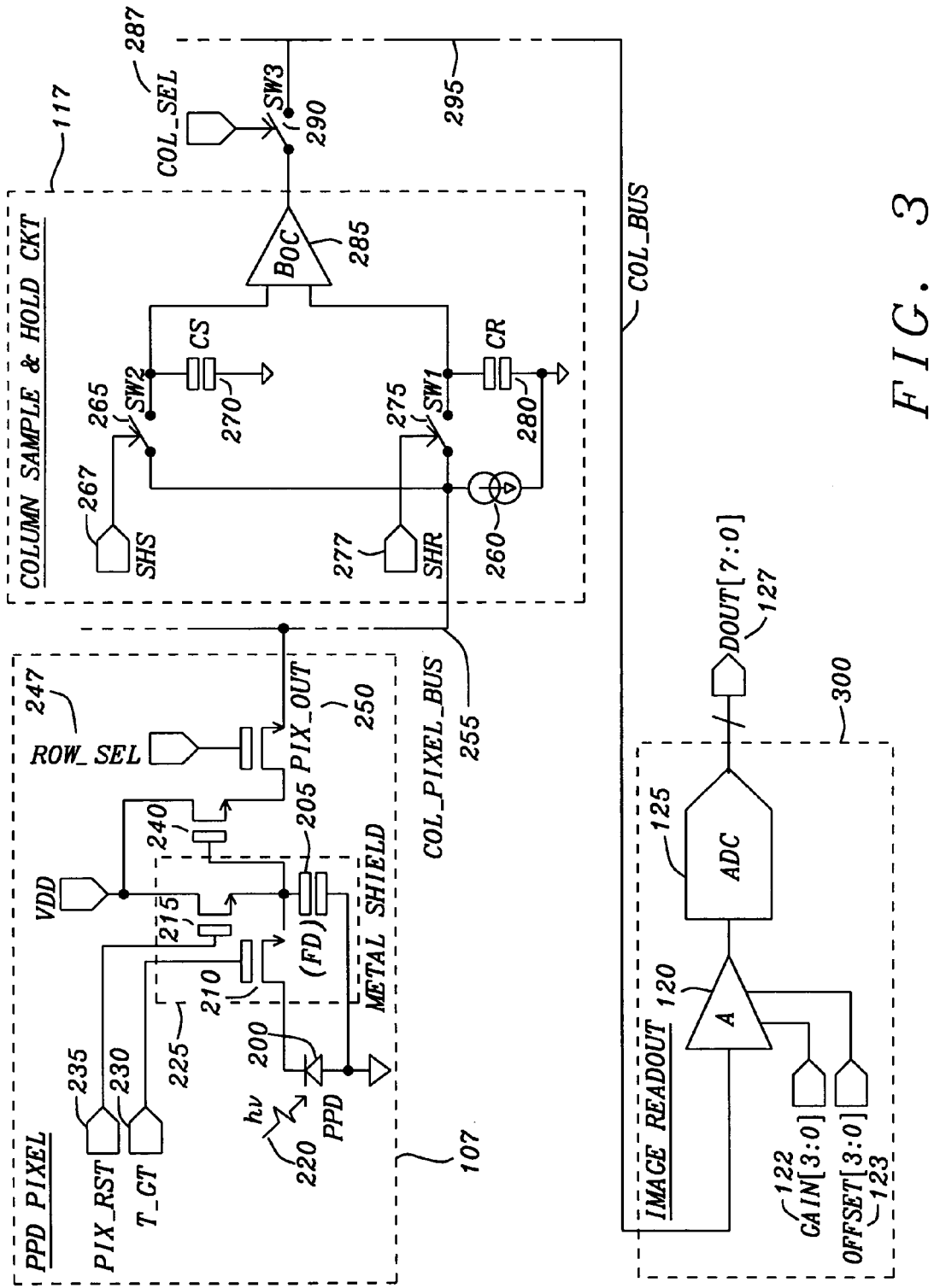
FIG. 3 is schematic diagram of a photo detection, photo conversion, and image readout path of a snapshot pinned photodiode CMOS active pixel image sensor.

The structure of each column of pinned photodiode CMOS active pixel image sensors 107 is shown in FIG. 3. The pinned photodiode CMOS active pixel image sensors 107 has a pinned photodiode 200, a floating diffusion storage node 205, a transfer gate switch 210, and a reset gate switch 215. The pinned photodiode receives the photons of light 220 for conversion to photoelectrons that are collected in the $N^+$ photo diode depletion regions OF the pinned photodiode 200. The photoelectrons are transferred to floating diffusion storage node 205 when the transfer gate switch 210 is activated. The number of electrons stored at the floating diffusion storage node 205 is indicative of the intensity of the light energy 220 impinging on the pinned photodiode 200. Upon completion of the transfer of the photoelectrons to the floating diffusion storage node 205, the transfer gate switch 210 is deactivated and the voltage potential of the collected and retained photoelectrons is applied to the gate of the NMOS transistor 240. When the row select signal 247 is activated the NMOS transistor 245, the pixel output electrical signal PIX_OUT 250 is transferred through the column pixel bus 255 to one column sample and hold readout cell 117.

The column sample and hold circuit 117 combines the column pixel row operation (pixel reset, row select) and the column operation (the photo generation, photo sensing). The Sample and Hold Sense signal 267 activates the switch $SW_2$ 265 to connect the pixel output electrical signal PIX_OUT 250 to the capacitor CS 270. Similarly, the Sample and Hold Reset signal 277 activates the switch $SW_1$ 265 to connect the pixel output electrical signal PIX_OUT 250 to the capacitor CR 280. The capacitor CS 270 samples and holds the pixel output electrical signal PIX_OUT 250 representing the intensity of light 220 impinging upon the pinned photodiode 200. The capacitor CR 280 samples and holds the pixel output electrical signal PIX_OUT 250 representative of the reset level of the floating diffusion storage node 205. The conversion electrical signal level is retained on the capacitor CS 270 and the reset voltage retained on the capacitor CR 280 are the input signals to the buffer 285. The reset voltage being used to provide offset correction for the conversion electrical signal level. The output of the buffer 285 is transferred through the switch SW3 290 to the column bus COL_BUS 290. The combination of the conversion electrical signal level and the reset signal causes the output voltage of the sample and hold circuit 117 to be equal to the differential voltage of pixel reset level and photo conversion electrical signal level, i.e., $V_{out}=V_{rst}-V_{sig}$. During the pixel readout, switch $SW_3$ 285 controlled by column select signal COL_SEL 287 transfers the differential voltage through the column bus COL_BUS 290 to the video amplifier 120 that applies the gain factor 122 and offset correction factor 123 to the output signal. The output of video amplifier 120 is the analog output that is digitized by an analog-to-digital converter 125. The output of the analog-to-digital converter 125 is the digital data word 127 that is transferred to the image processor 140 of FIG. 2.

The pinned photodiode active pixel image sensor array 105 utilizes four transistor pinned photodiode CMOS active pixel image sensors with approximately 2.0 μm×2.0-μm pitch. The critical performance parameter of the four transistor pinned photodiode CMOS active pixel image sensors is the shutter rejection ratio (SRR). The ratio of readout time compared to the shortest integration time requirement of 20 μsec presents a challenge to achieve 50,000×(94 dB) SRR under bright ambient illumination during readout. A snapshot pinned photodiode CMOS active pixel image sensor of the prior art with snapshot operation is not able to achieve such a high SRR due to light leakage and substrate charge leakage to the pixel charge storage node during the readout time. Light leakage is due to the stray light finding its way to the storage node if the storage node is not fully covered by a metal shield. The light leakage can be minimized by an optional metal shield 295 of this invention that covers an optional silicided floating diffusion storage node 205. Substrate charge leakage is caused by the photoelectrons generated in the substrate beneath the photon sensing area drifting to the floating diffusion storage node 205. A deep N-well charge isolation layer of this invention is placed under the storage node 205 to prevent the charge leaking to the storage node.

Figure 5A:
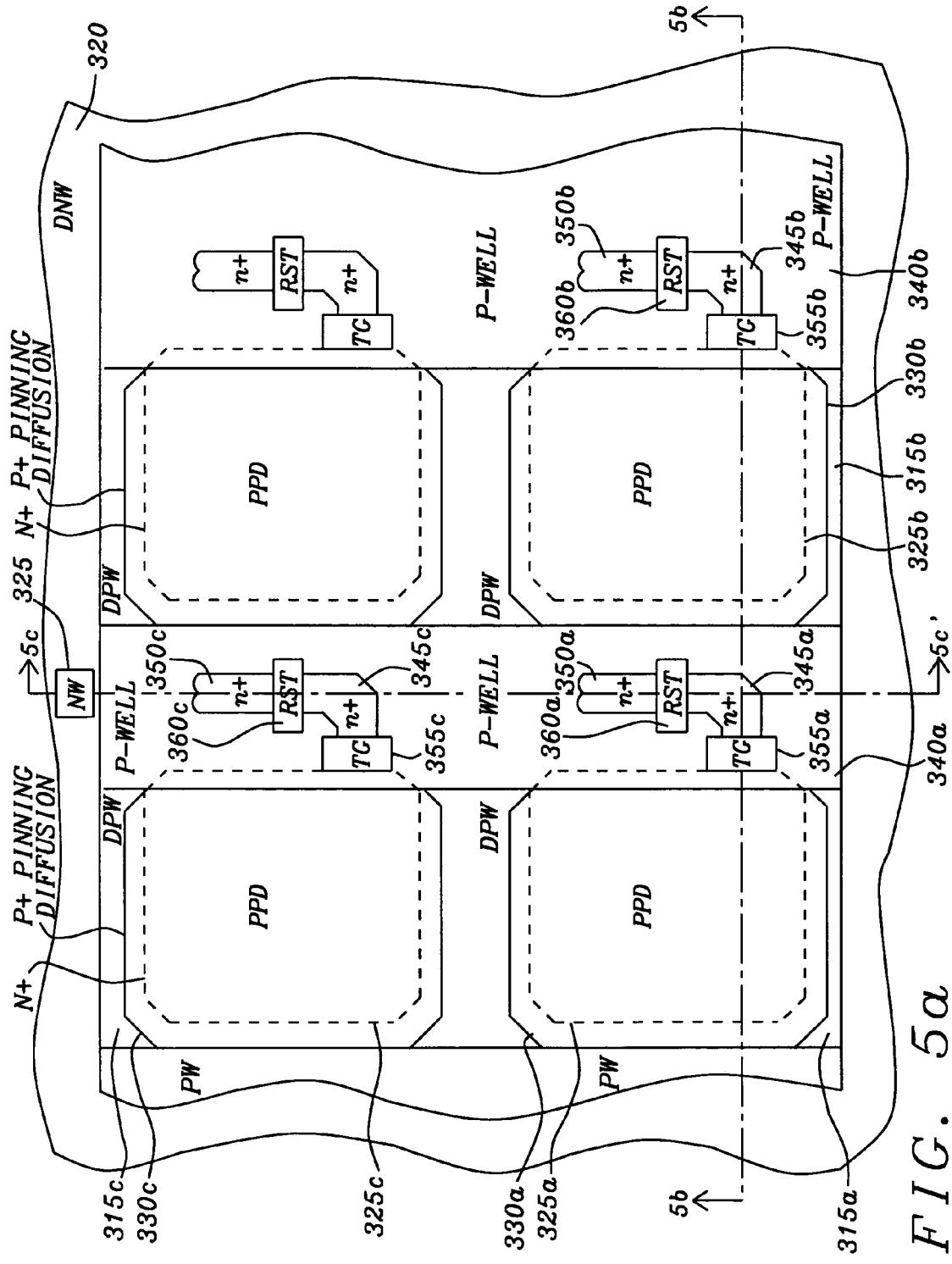
FIGS. 5a-5c are a top plan view and cross sectional views of a snapshot pinned photodiode CMOS active pixel image sensor of this invention.
Figure 5B:
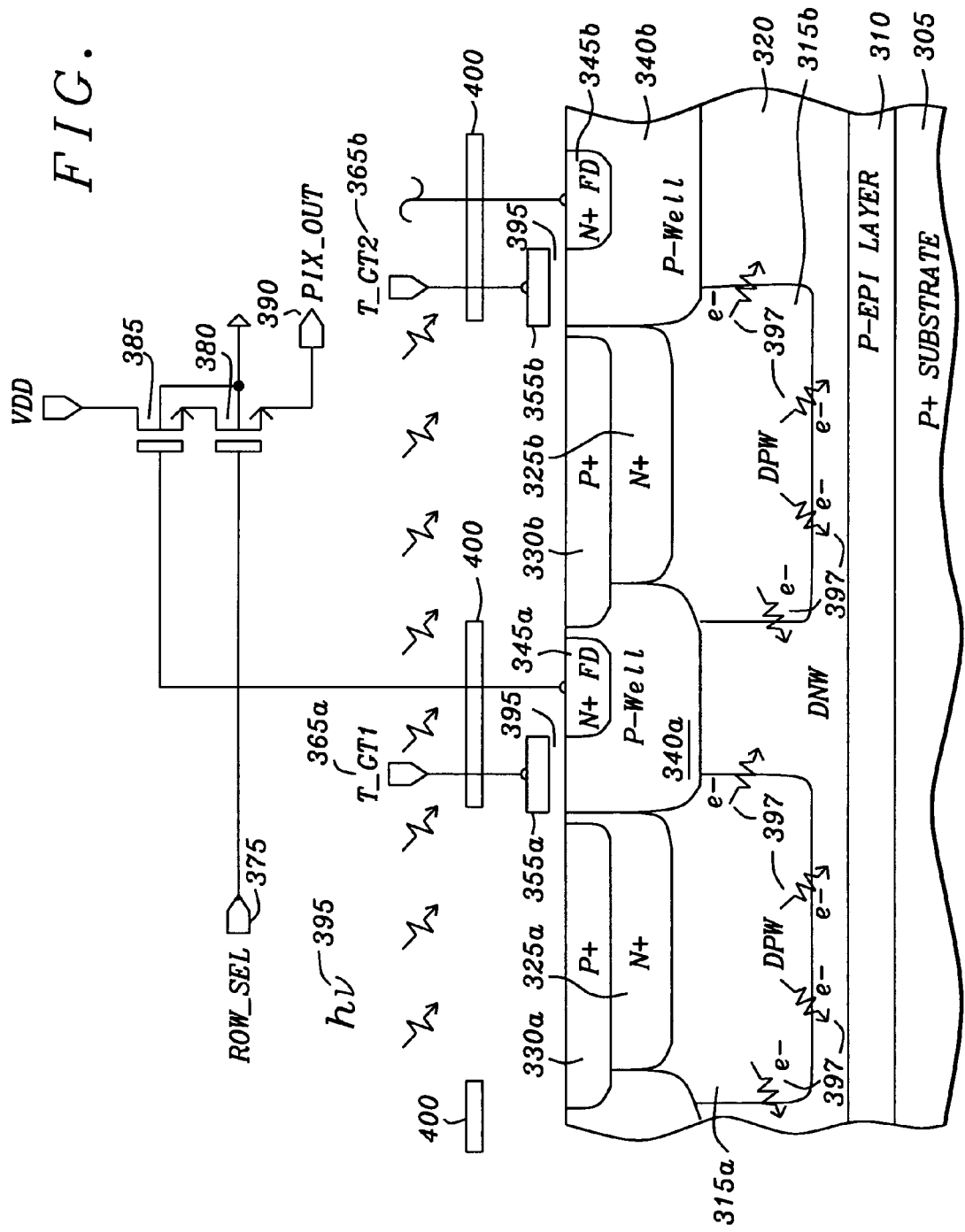
Figure 5C:
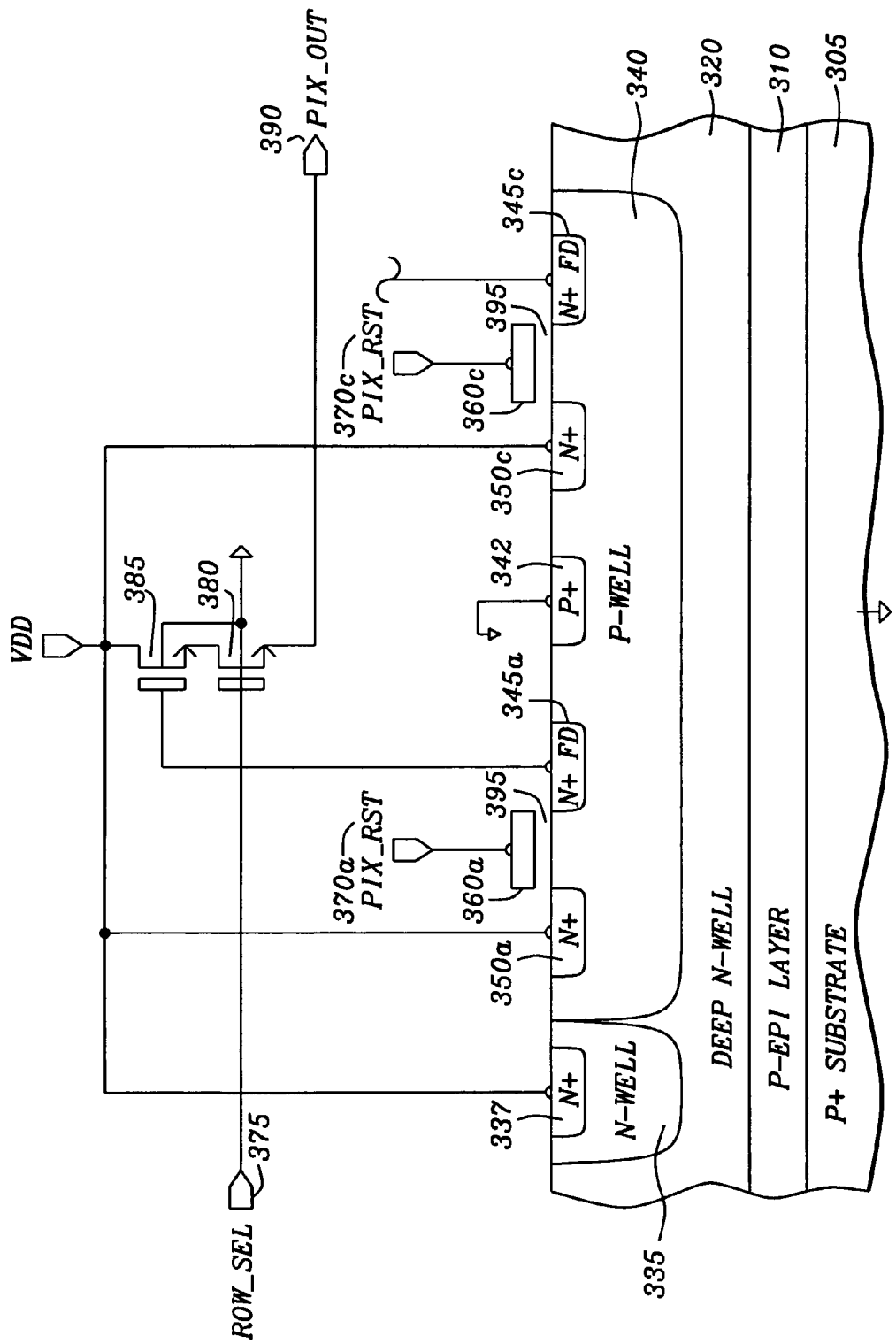

Refer now to FIGS. 5a-5c for a discussion structure of the ultra high shutter rejection ratio snapshot pinned photodiode active pixel image sensor of this invention. FIG. 5a illustrates a top plan view of four pinned photodiodes of a 2×2 section of an array of the pinned photodiode active pixel sensors of this invention. FIGS. 5b and 5c are orthogonal cross sectional views of the 2×2 section of the array of FIG. 5a. A substrate 305 heavily doped with a P-type impurity has its surface further doped with a complementary impurity to create a lightly doped P-type epitaxial layer 310. A P-type material is diffused into the surface of the substrate 305 to form the contact diffusions not shown for the P-type epitaxial layer 310. An N-type material is deeply diffused into the surface of the substrate 305 to a relatively great depth in the area into which the transfer gate switch and the reset gate switch are to be formed to form the deep N-well isolation barrier 320. The P-type material is deeply diffused into the surface of the substrate 305 to a relatively great depth in the area into which the pinned photodiode is to be formed to form the deep P-well conduction well 315a, 315b, and 315c.

The N-type material is then diffused into the surface of the substrate 305 to contact the deep N-well isolation barrier 320 and form the diffusion N-well 335. The N-type material is then diffused into the surface of the substrate 305 to contact the diffusion N-well 335 to form the contact diffusion 337. The contact diffusion 337 is then connected to the power supply voltage source VDD. The diffusion N-well 335 and the contact diffusion 337 are placed at the periphery of the ultra high shutter rejection ratio snapshot pinned photodiode active pixel image sensor array. Each of the ultra high shutter rejection ratio snapshot pinned photodiode active pixel image sensor arrays or sub-arrays will be placed in a separate deep N-well isolation barrier well 320 with the external contact to the power supply voltage source VDD.

The P-type material is diffused to a lightly doped impurity level in the surface above the deep N-well isolation barrier 320 to form the P-type isolation wells 340a and 340b. The P-type isolation wells 340a and 340b are in contact with the deep P-well conduction well 315a and 315c which in turn are in contact with the P-type epitaxial layer 310 of the substrate 305. The P-type material is further diffused to a heavily doped impurity level to form the $P^+$-contact 342, which is connected to the ground reference voltage source. An N-type material is heavily diffused into the surface of the substrate 305 at the location of the P-type isolation wells 340a and 340b to form the $N^+$ source/drain regions 350a, 350b and 350c and the floating diffusion storage nodes 345a, 345b and 345c.

The N-type material is diffused in to the surface of the substrate 305 at the locations of the deep P-well conduction well 315a, 315b, and 315c to form the $N^+$ photo diode depletion regions 325a, 325b, and 325c. The P-type material is heavily diffused relatively shallow into the surface of the epitaxial layer 310 of the substrate 305 above the $N^+$ photo diode depletion regions 325a, 325b, and 325c to form the P-type pinning diffusions 330a, 330b and 330c. The P-type pinning diffusions 330a, 330b and 330c encompass the surface of the $N^+$ photo diode depletion regions 325a, 325b, and 325c and overlap into the surface of the P-type isolation wells 340a and 340b. The P-type pinning diffusions 330a, 330b and 330c force depletion of the surface of the $N^+$ photo diode depletion regions 325a, 325b, and 325c in forming the pinned photodiodes of the image sensors. The P-type pinning diffusions 330a, 330b and 330c assist in the depletion of the $N^+$ photo diode depletion regions 325a, 325b, and 325c, but the complete depletion of the $N^+$ photo diode depletion regions 325a, 325b, and 325c is mostly determined by the overall doping profile both at the top and bottom.

A gate insulator or thin oxide 395 is placed on the surface of the substrate 305 and polycrystalline silicon is formed on the surface to form the transfer gates 355a, 355b, and 355c and the reset gates 360a, 360b and 360c. The $N^+$ photo diode depletion regions 325a, 325b, and 325c, the floating diffusion storage nodes 345a, 345b and 345c, and the transfer gates 355a, 355b, and 355c form the transfer gate switches for each pixel illustrated and the floating diffusion storage nodes 345a, 345b and 345c, the $N^+$ source/drain regions 350a, 350b and 350c, and the reset gates 360a, 360b and 360c form the reset gate switches of each active pixel sensor.

The transfer gates 355a and 355b of the transfer gate switches are each connected to transfer gating signals T_GT1 365a and 365b. The transfer gate 355c is similarly connected to a transfer gating signal (not shown). The reset gates 360a, 360b and 360c of the reset gate switches are connected to the pixel reset signals PIX_RST 370a and 370c. Similarly the reset gate 360b is connected to a pixel reset signal (not shown). The $N^+$ source/drain regions 350a, 350b and 350c are connected to a power supply voltage source VDD. The floating diffusion storage node 345a is connected to the gate of the NMOS transistor 385. The drain of the NMOS transistor 385 is connected to the power supply voltage source VDD and the emitter of the NMOS transistor 385 is connected to the drain of the NMOS transistor 380. The gate of the NMOS transistor 380 is connected to the row select signal 375. The NMOS transistor 385 acts as a source follower to buffer the electrical signal created by the photoelectron charge collected in the floating diffusion 345a. It should be noted that each of the floating diffusion storage nodes 345b and 345c are similarly connected to a NMOS transistors equivalent to the NMOS transistor 385 which is in turned connected to the NMOS transistor 380.

The photons 395 that impinge upon the pinned photodiodes are converted to photoelectrons and collected in the N+ photo diode depletion regions 325a, 325b, and 325c. A mechanical or electrical shutter is activated to expose the image sensor to the photons 395 of the light image for an integration period. At the completion of the integration period for the collection of the photoelectrons, the transfer gate 355a by the transfer gating signal 365a is activated to turn on the transfer gate switch to transfer the collected photoelectrons from the N+ photo diode depletion region 325a, to the storage node of the floating diffusion 345a. When the collected photoelectrons are retained at the floating diffusion 345a the row select signal 375 is activated to turn on the transistor 380 to gate the pixel output electrical signal PIX_OUT 390 to external circuitry for processing and display. The amplitude of pixel output electrical signal PIX_OUT 390 is indicative of the intensity of the light energy or the number of photons 395 absorbed by the N+ photo diode depletion region 325a of the pinned photodiode 345. Once the pixel output electrical signal PIX_OUT 390 is read out the pixel reset signal 370a is activated to turn on the reset gate switch and the N+ photo diode depletion region 325a and the storage node floating diffusion 345a are emptied of the photoelectrons.

An optional metal shield 400 maybe placed over the transfer gate switches and the reset gate switches to prevent the light energy 395 from impinging upon the transfer gate switch and the reset gate switch and is not converted to stray photoelectrons that collect in the floating diffusion 330. The metal shield 400 maybe either a separate shield placed above the transfer gate switches and the reset gate switches or maybe the interconnecting wiring, interlayer vias, and substrate contact metallurgy placed above the transfer gate switches, and the reset gate switches.

Some of the photons 395 are converted in the deep P-well conduction well 315a to the photoelectrons 397. Some of the converted photoelectrons 397 will be attracted to the N+ photo diode depletion region 15a. However, since the deep N-well isolation barrier 320a is connected to the power supply voltage source VDD, some of the stray photoelectrons 397 are attracted from the deep P-well conduction well 315a. The stray photoelectrons 397 are captured by the deep N-well isolation barrier 320 and transferred to the power supply voltage source VDD. The stray photoelectrons 397 from adjacent pinned photodiode CMOS active pixel image sensors 107 are also captured by the N-well isolation barrier 320a.

Some photons 395 will impinge upon the P-type isolation wells 340a and 340b in spite of the metal shield 400. These photons 395 that impinge upon the P-type isolation wells 340a and 340b will drift either to the storage node floating diffusions 345a and 345b or to the deep N-well isolation barrier 320. It can be shown that the number of photoelectrons generated in the P-type isolation wells 340a and 340b is decreased by a ratio of 1:50,000 or approximately 94 db.

Figure 4A:
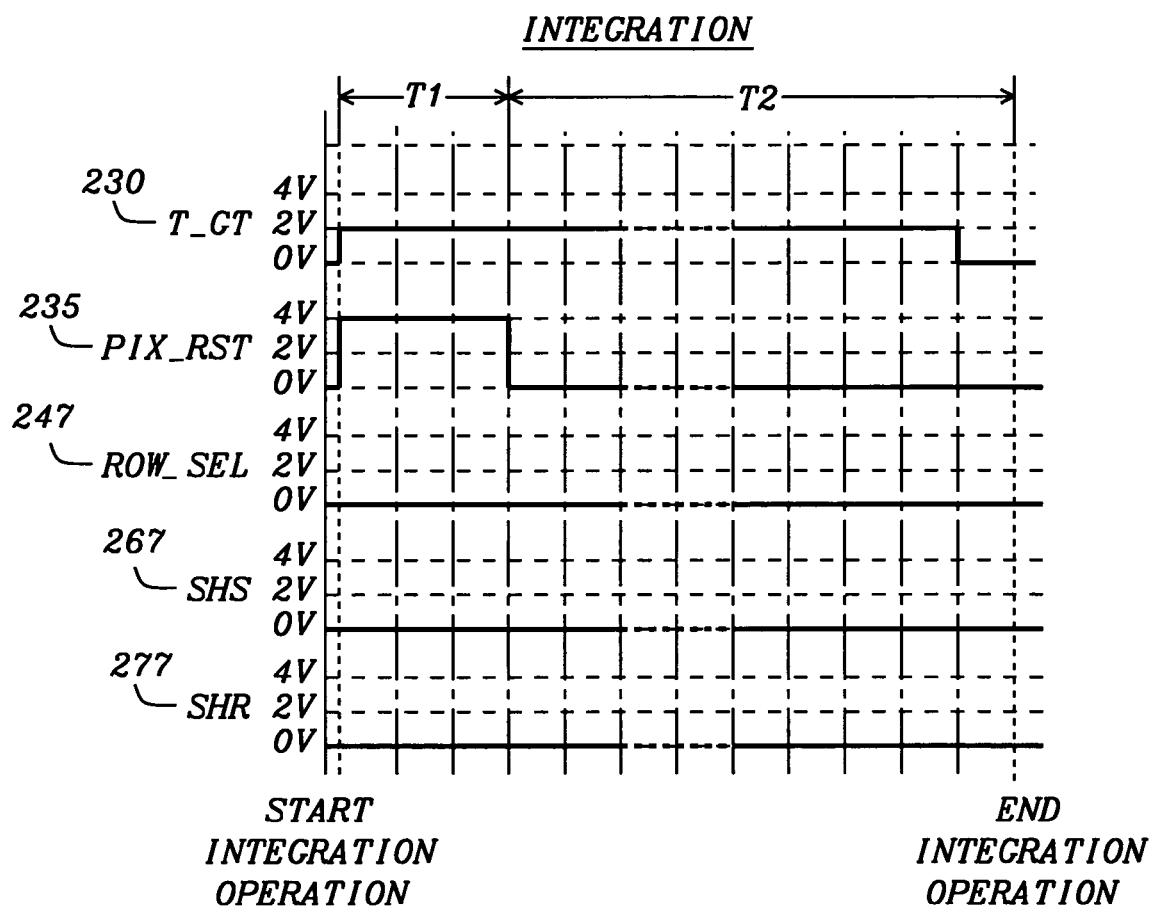
FIGS. 4a and 4b are plots of the control signals of the photo detection, photo conversion, and image readout of a snapshot pinned photodiode CMOS active pixel image sensor.
Figure 4B:
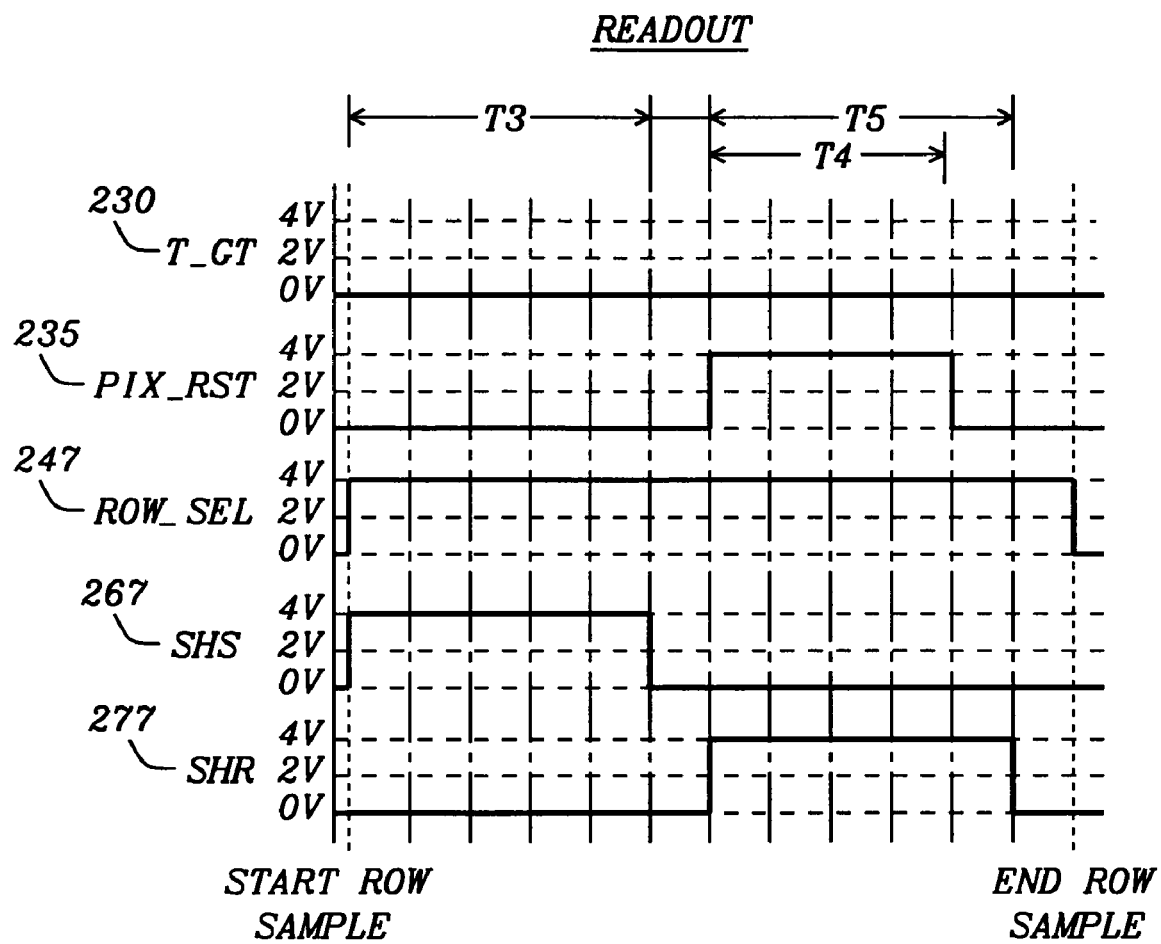

Referring now to FIGS. 3, 4a, and 4b for a discussion of the operation of the snapshot pinned photodiode CMOS active pixel image sensors 107 of this invention. The integration process is shown in FIG. 4a. During the time period T1, the transfer gate signal 230 and the reset gate signal 235 are activated to turn on the transfer gate switch 210 and reset gate switch 215 to remove residual charge from the N+ photo diode depletion region of the pinned photodiode 200 and the floating diffusion storage node 205 and begin integration of the photons 220.

During the time period T2, the reset gate signal 235 is deactivated to turn off reset gate switch 215 to initiate the integration period where the photons 220 are converted to photoelectrons in the N+ photo diode depletion region of the pinned photodiode 200. The photoelectrons are then collected in floating diffusion storage node 205. The integration time period T2 is completed by deactivating the transfer gate signal 230 is deactivated to turn off the transfer gate switch 210.

The readout process is shown in FIG. 4b. The Sensing of the photoelectrons occurs during the time period T3. The Sample and Hold Sense signal 267 is activated to turn on the switch $SW_2$ 265 to sample the charge level of the floating diffusion storage node 205 and hold the sample on the capacitor CS 270. At the end of the time period T3, the Sample and Hold Sense signal 267 is deactivated to turn off the switch $SW_2$ 265. At the beginning of the time periods T4 and T5, the reset gate signal 235 is activated to turn on the reset gate switch 215 to remove the collected photoelectrons from the floating diffusion storage node 205. The Sample and Hold Reset signal 277 activates the switch $SW_r$ 265 to connect the pixel output electrical signal PIX_OUT 250 to the capacitor CR 280. The capacitor CR 280 is then set to the value of the reset value of the floating diffusion storage node 205. At the end of the time period T4, the reset gate signal 235 is deactivated to turn off the reset gate switch 215. The Sample and Hold Reset signal 277 remains active until the end of the time period T5 to sample and hold the reset level of the floating diffusion storage nodes 205 to the capacitor CR 280. The voltages of the capacitor CS 270 and capacitor CR 280 are the inputs to the buffer 285 and at the activation of the column select signal 287, the output signal of the buffer 285 is transferred to the column bus 295 and the image readout circuit 300.

Figure 6:
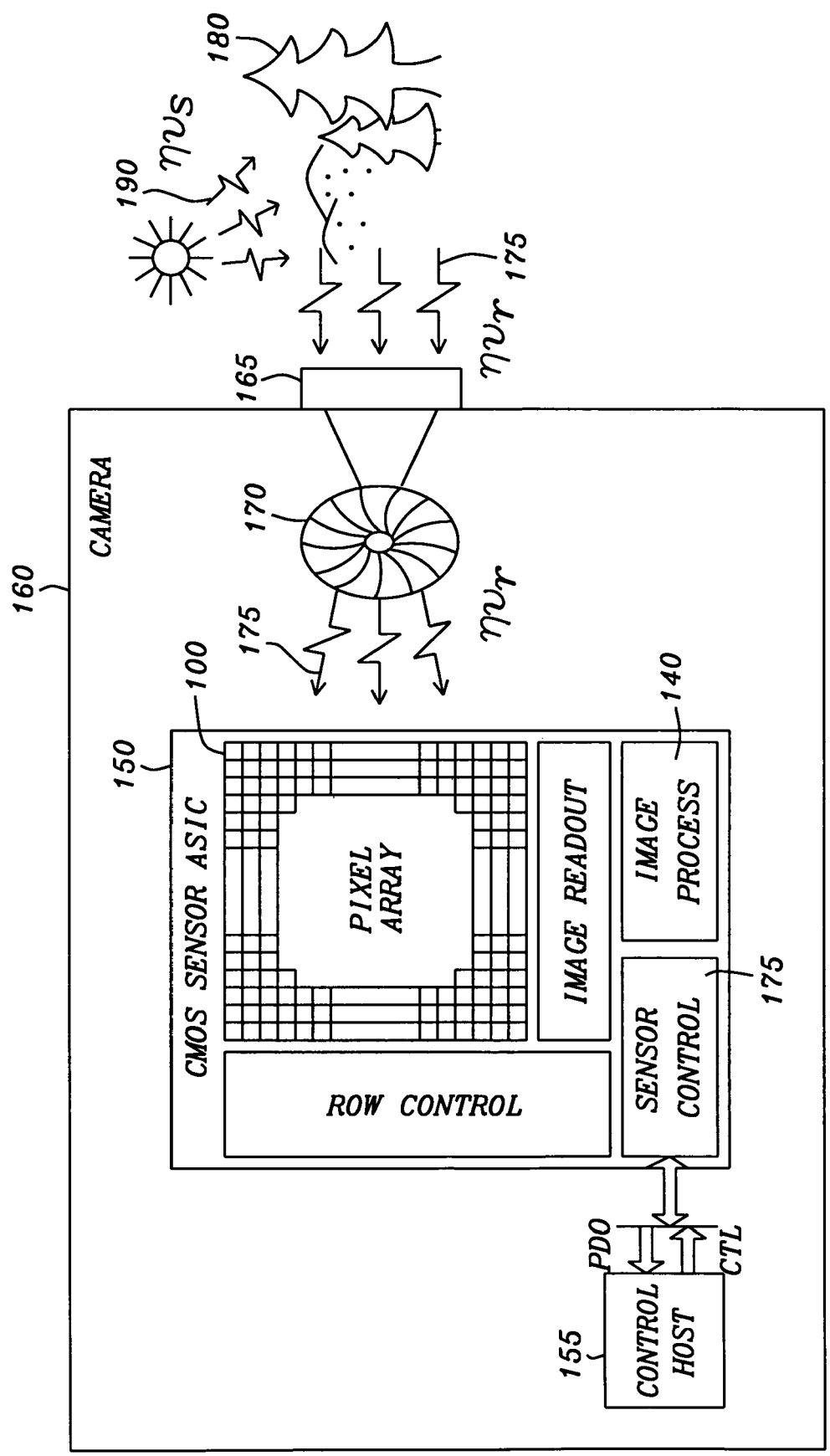
FIG. 6 is block diagram of an camera processing system including an image processing application specific integrated circuit of FIG. 2.

A camera system using the snapshot pinned photodiode CMOS active pixel image sensor of this invention is illustrated in FIG. 6. The camera system 160 includes the image processing application specific integrated circuit 150, Control host 155, a focusing lens 165, and a mechanical shutter 160. As described above the image processing application specific integrated circuit 150 contains a low resolution snapshot pinned photodiode pixel image sensor array 100 and on-chip image processing 140. The image processing application specific integrated circuit 150 also contains sensor I/O control 175 with an interface with the control host 155. Switching control activates opening and closing the mechanical shutter 170 to allow passage of reflected light 175 to enter the camera and impinge upon the array of snapshot pinned photodiode CMOS active pixel image sensors 105. Ambient lighting 190 is reflected from a scene 180 as the reflected light 175.

The snapshot pinned photodiode CMOS active pixel image sensors of the array 100 of this invention are as described in FIGS. 5a-5c and have the required high shutter rejection ratio that allows the image sensor to have an exposure time that is chosen to be a very small fraction of the frame rate (readout time). In the preferred embodiment of the camera system, the exposure time is as small as approximately 20 μsec with a frame rate of approximately 75 frames per second. This allows a readout and processing time of greater than approximately 10 msec.

The ambient lighting 190 reflects from the scene 180 and the reflected light 175 is captured by the array of snapshot pinned photodiode CMOS active pixel image sensors 100. Because of the high shutter rejection ratio, the effective motion freeze of any moving object within the scene 180 is independent of the ambient illumination 190. In this particular application, the image processing application specific integrated circuit 150 achieves the same motion freeze whether the target is in dark ambient light 190 or extremely bright ambient light 190. The integration time (exposure time) is controlled by sensor control 175 and the motion freeze is achieved.

Figure 7A:
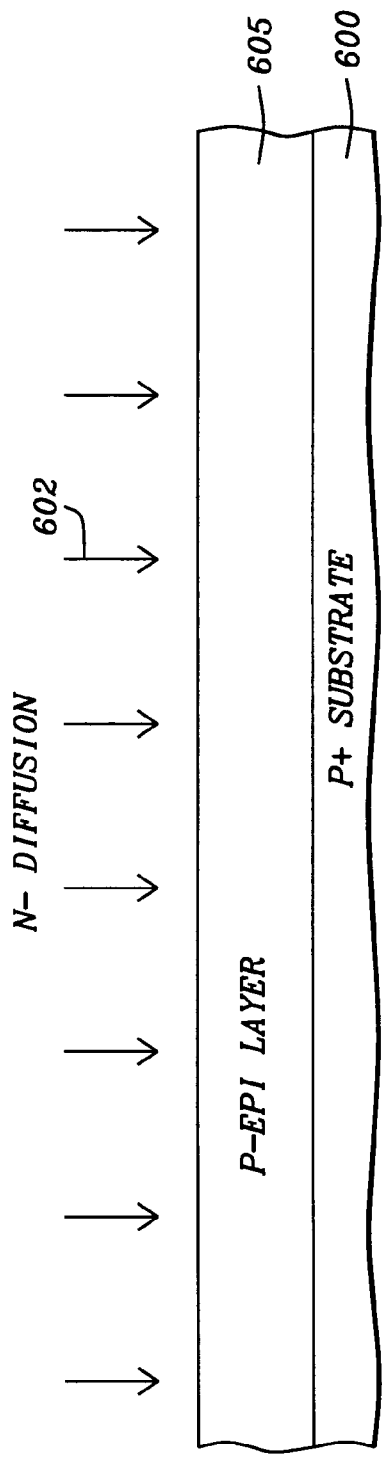
Figure 7B:
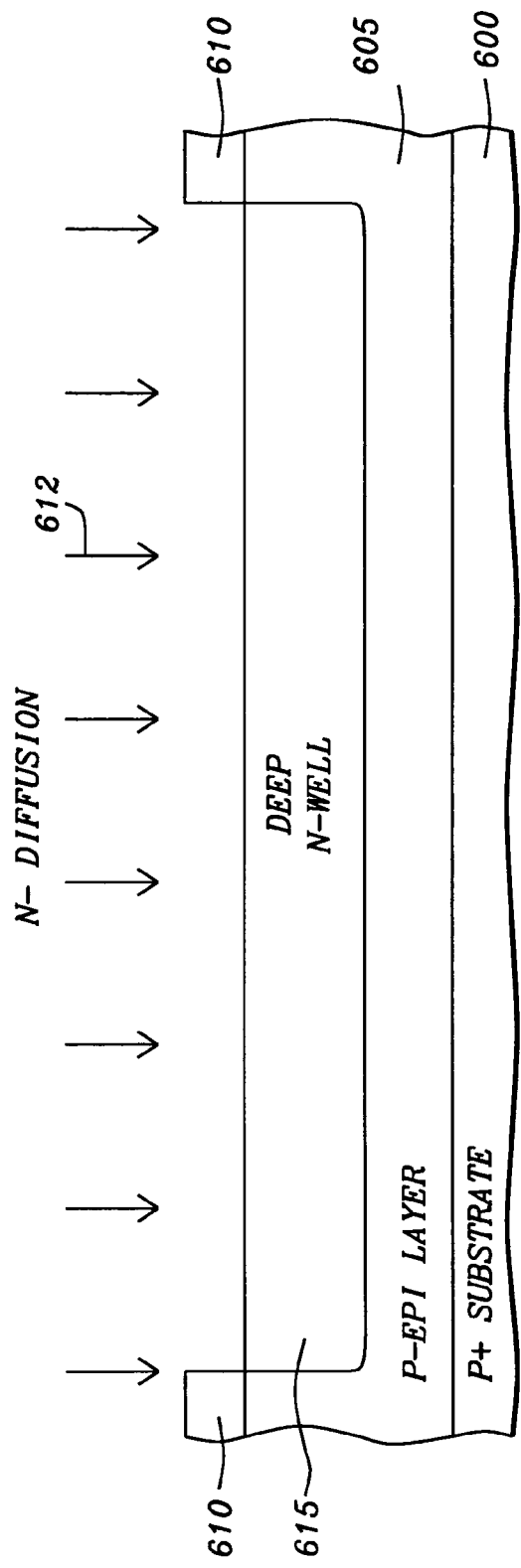

Refer now to FIGS. 7a-7k for a discussion of a method for forming a pixel image sensor having a high shutter rejection ratio. A heavily doped P-type substrate 600 doped is provided. It should be noted that the Figures having a suffix of -1 and -2 are orthogonal cross sectional views of the substrate 600 for a common process step. In FIG. 7a, an N-type impurity 602 is diffused into the surface of the substrate to form an epitaxial layer 605. In FIG. 7b, a photo-mask 610 is applied to the surface of the substrate 600 and the N-type impurity 612 is diffused in an opening of the photo mask 610 into the surface of the substrate 600 to a relative great depth from a surface of the substrate 600 and beneath an area designated to contain a storage node and storage node control transistor switches of the pixel image sensor to form an deep N-well isolation barrier 615. The N-well isolation barrier is biased in operation to a biasing voltage that is approximately the voltage level of the power supply voltage source VDD to prevent substrate charge leakage caused by photoelectrons generated in the deep P-well conduction well beneath $N^+$ photo diode depletion region of the pinned photodiode of the pixel image sensor from drifting to the storage node.

Figure 7C:
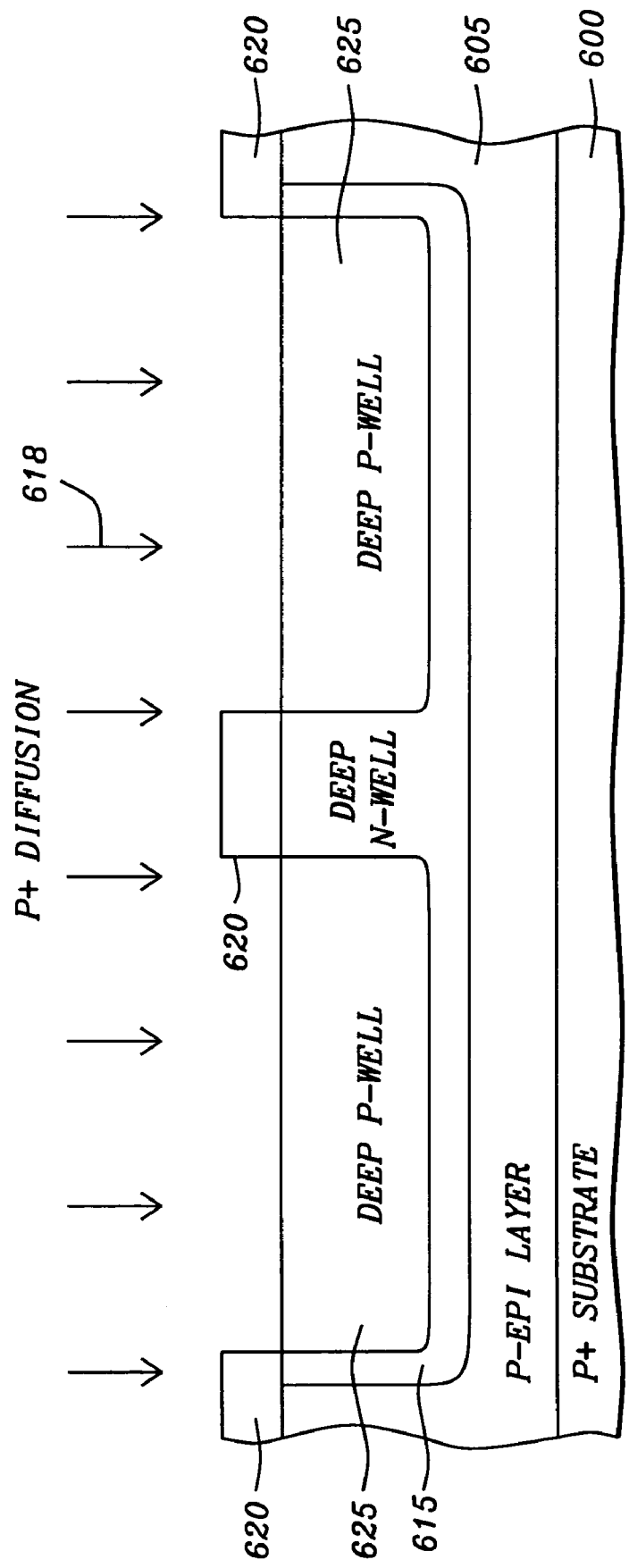
Figure 7D:
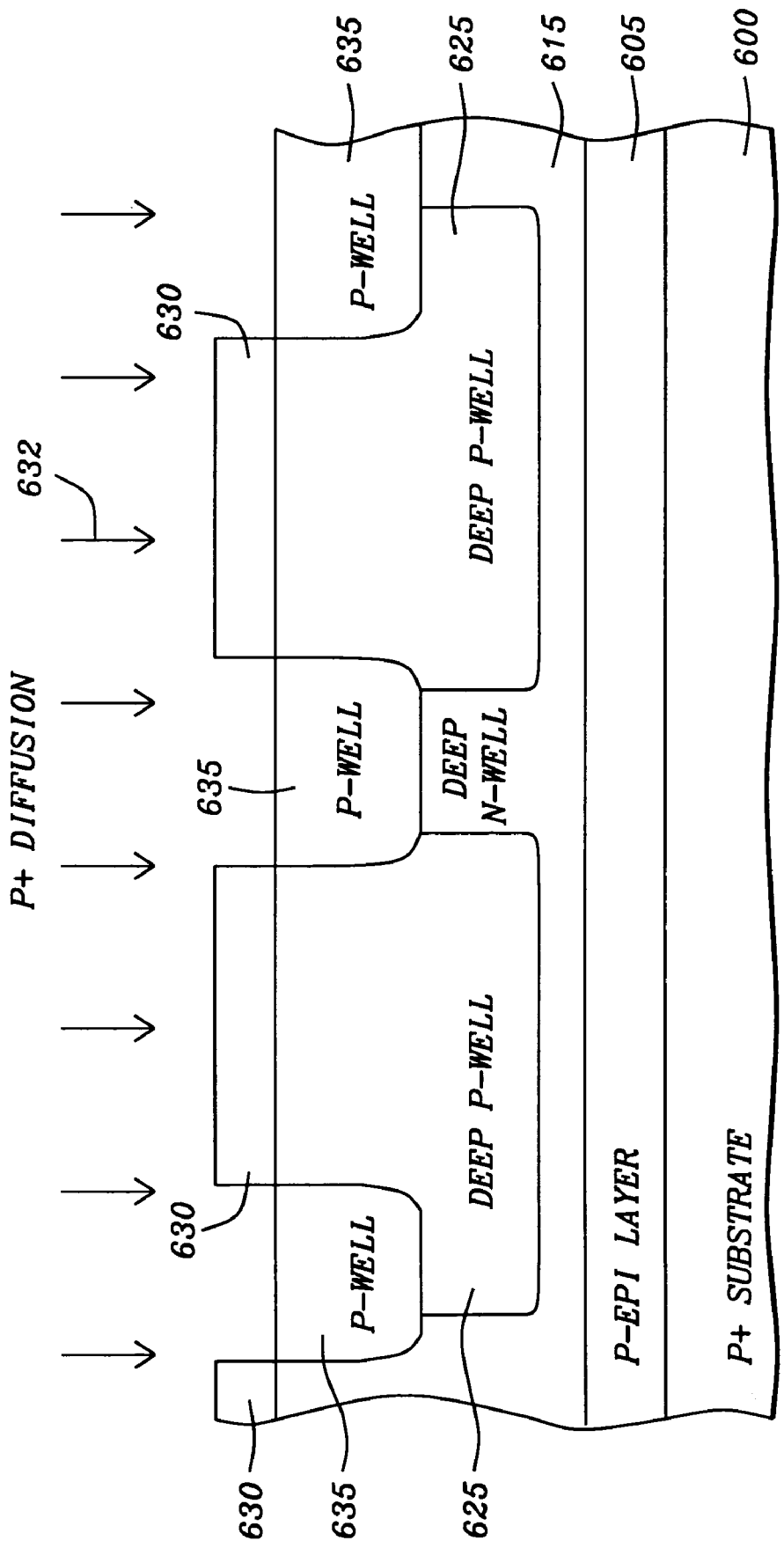

In FIG. 7c, a photo mask 620 is placed on the surface of the substrate 600 and a P-type impurity 618 is diffused into an opening in the photo mask 620 into the surface of the substrate 600 to form the deep P-well conduction wells 625. In FIG. 7d, a photo mask 630 is placed on the surface of the substrate 600 and the P-type impurity 632 is diffused into openings in the photo mask 630 into the substrate 600 to form the P-diffusion wells 635. The P-diffusion wells 635 are diffused into the substrate 600 to a depth less than the relatively great depth but in contact with the deep N-well isolation barrier 615.

Figures 1, 7E:
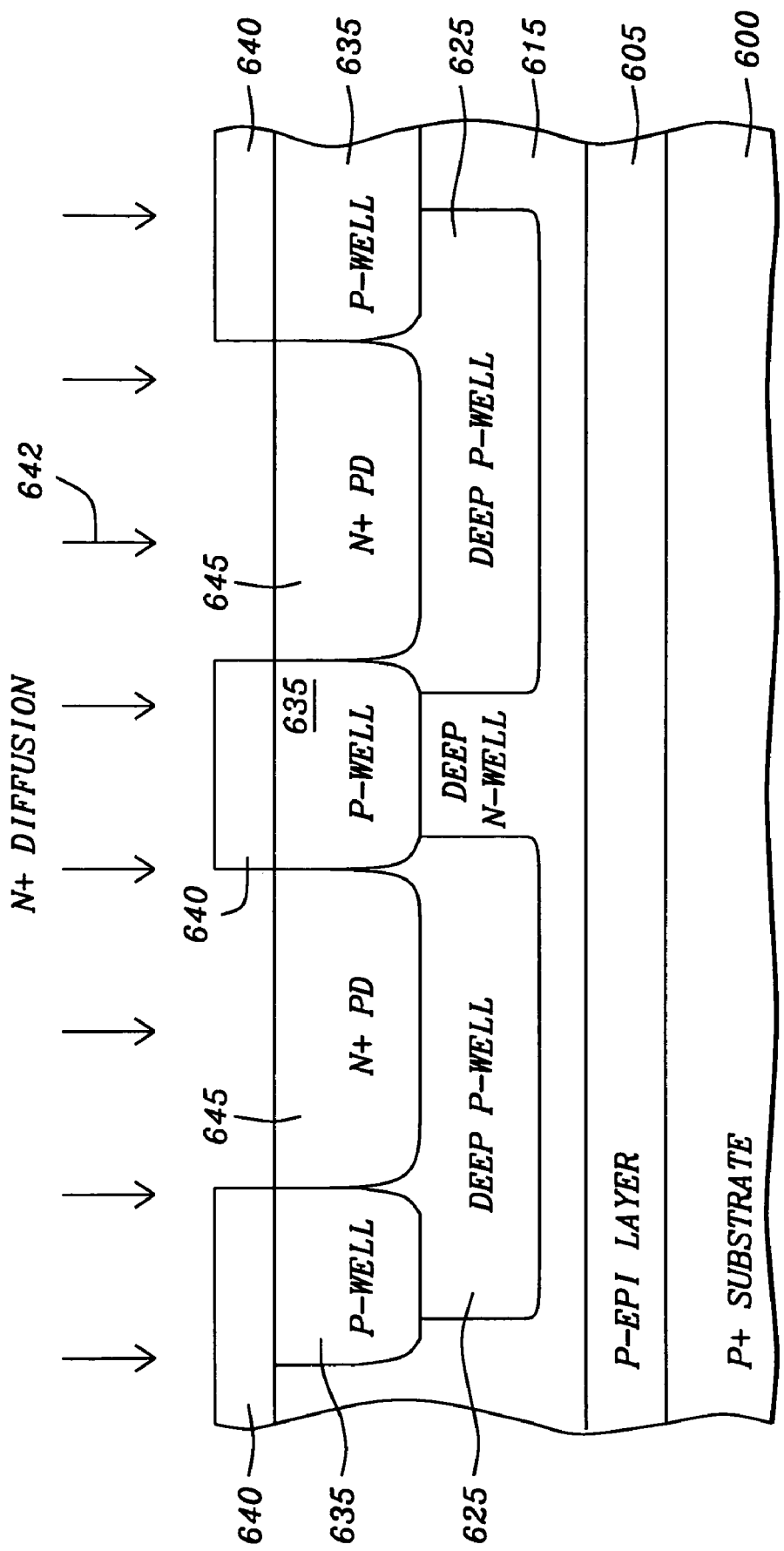
Figures 2, 7E:
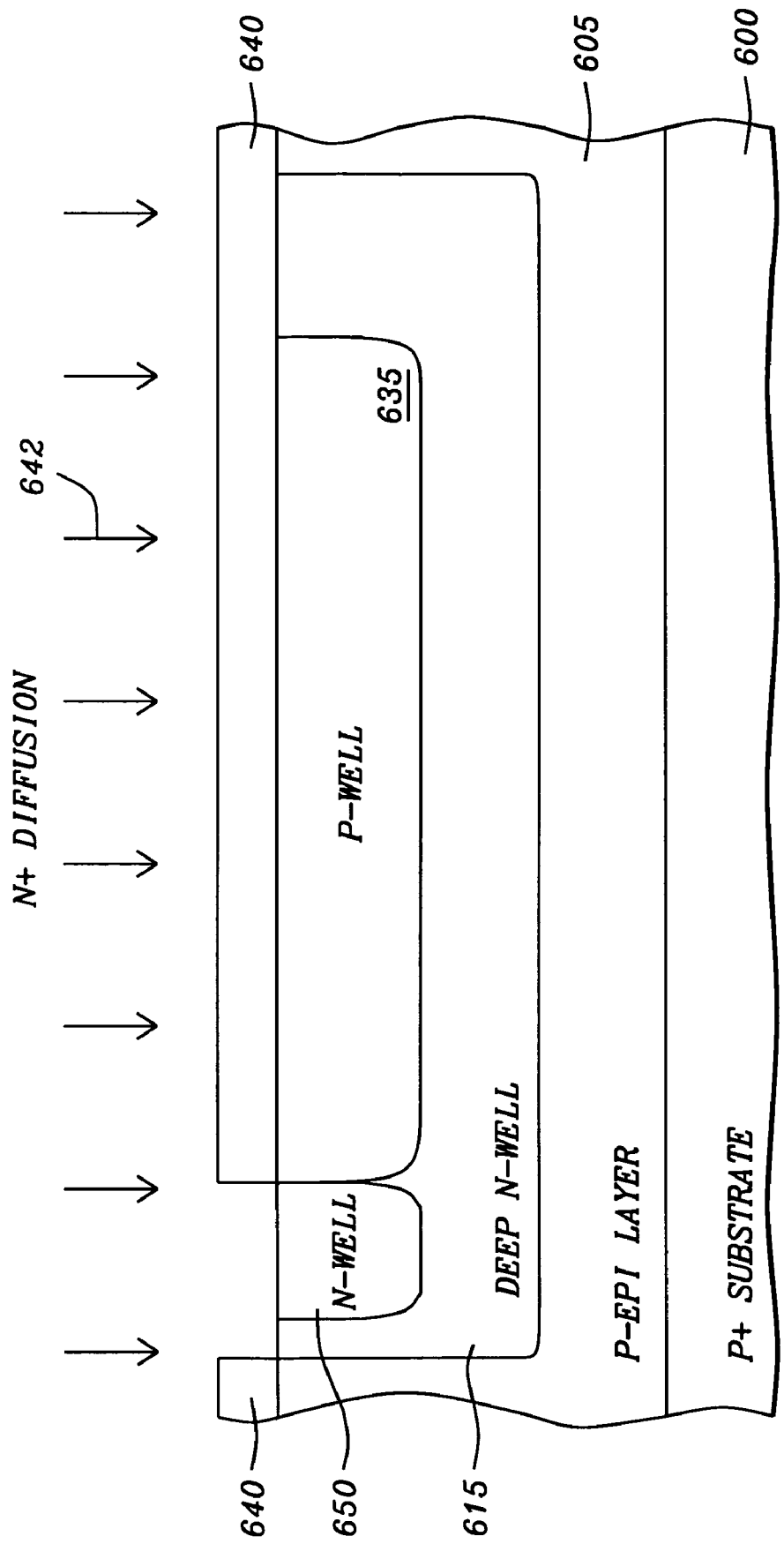

In FIGS. 7e-1 and 7e-2 a photo mask 640 is placed on the surface of the substrate 600 and the N-type impurity 642 is diffused into openings in the photo mask 640 into the substrate 600 to form the $N^+$ photo diode depletion regions 645 and the N-type diffusion well 650. The $N^+$ photo diode depletion regions 645 are diffused into the substrate 600 to a depth less than the relatively great depth but in contact with the deep P-well conduction wells 625. The deep N-well isolation barrier 615 is connected through the diffusion well 650 to a biasing voltage to channel the photoelectrons away from the storage node. The diffusion well 650 is placed at the external periphery of the snapshot pinned photodiode CMOS active pixel image sensor array.

Figures 1, 7F:
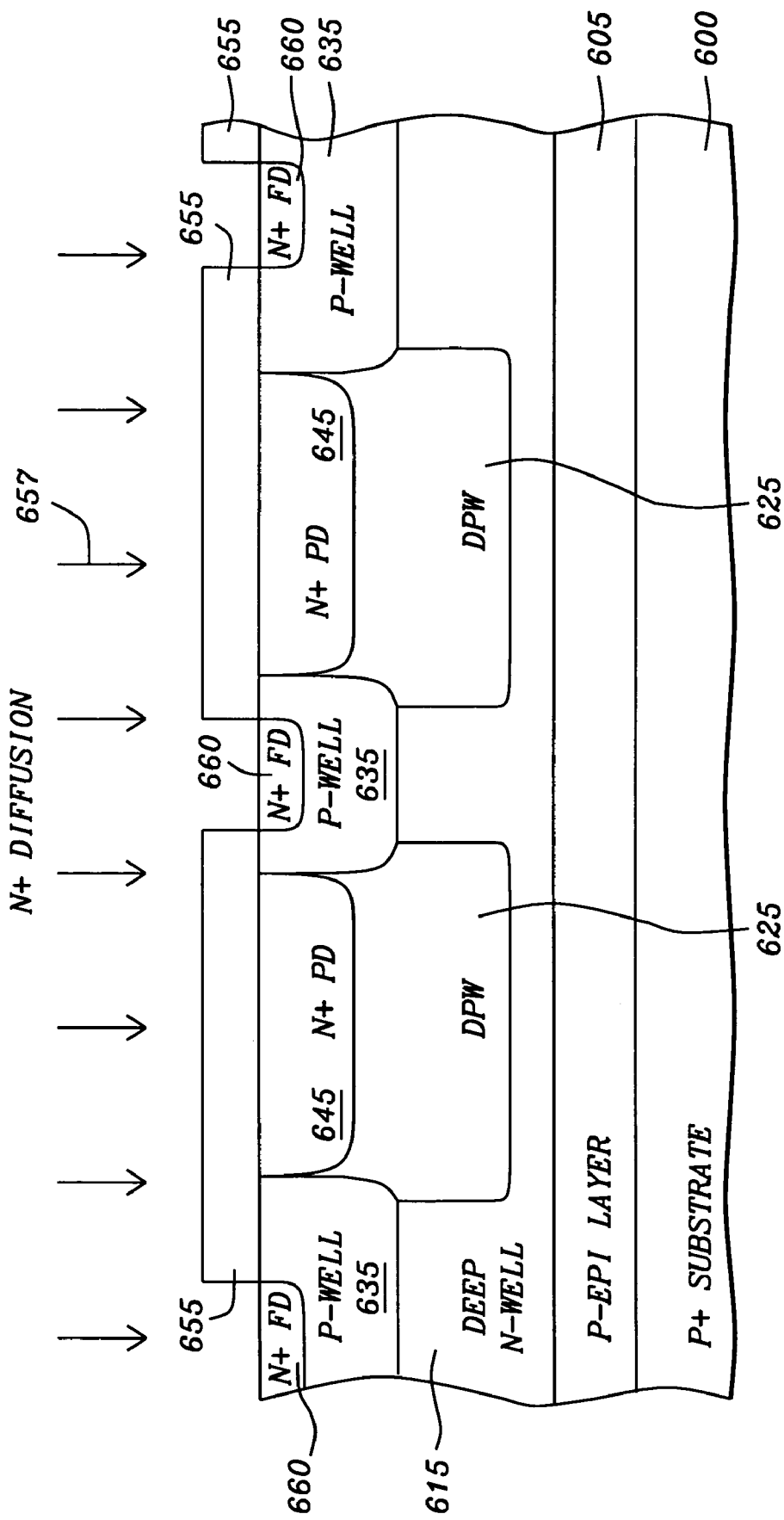
Figures 2, 7F:
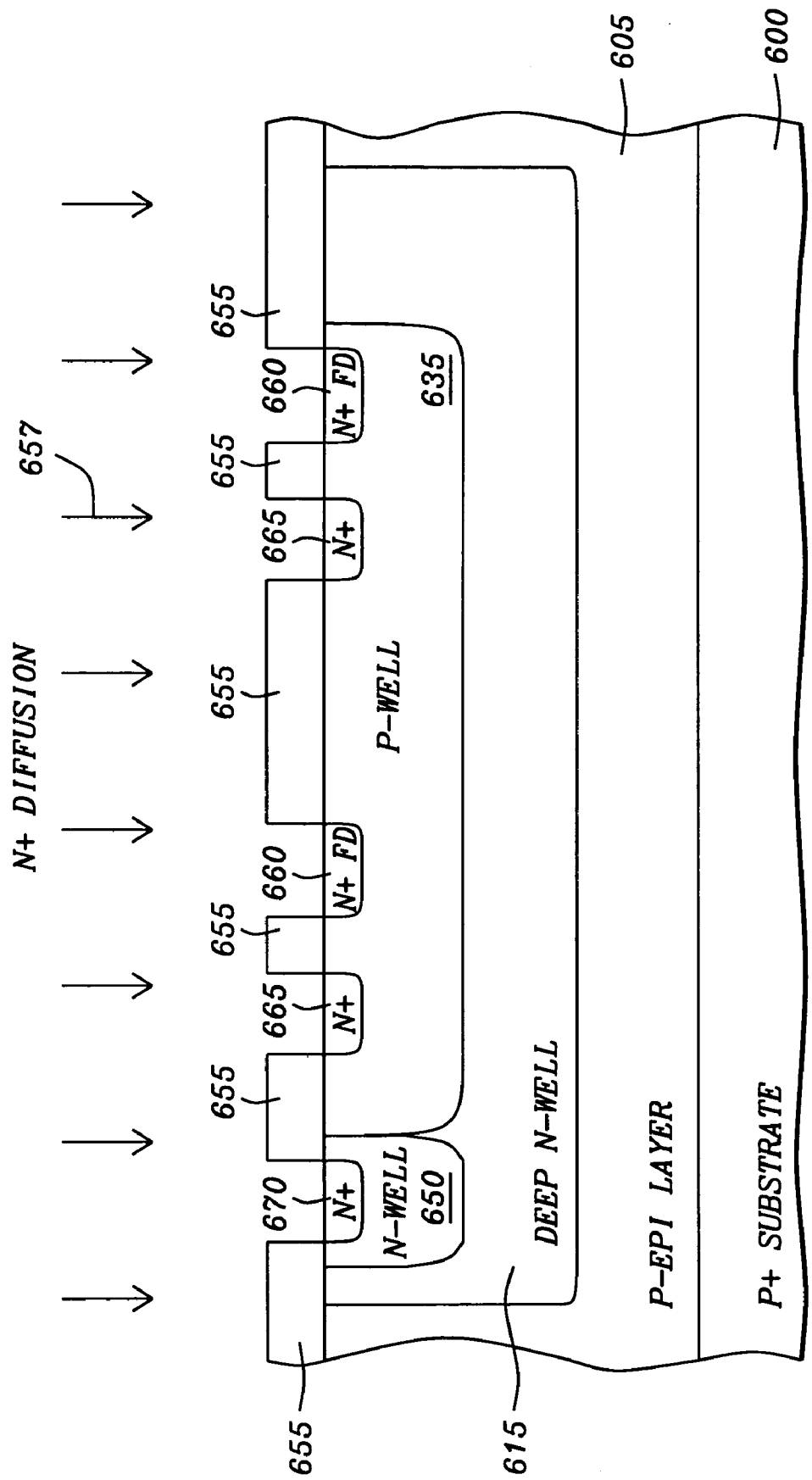

In FIGS. 7f-1 and 7f-2, a photo mask 655 is placed on the surface of the substrate 600 and the N-type impurity 657 is diffused into openings in the photo mask 655 into the substrate 600 to form the $N^+$ floating diffusion storage nodes 660, the $N^+$ source/drain regions 665 and the N-type diffusion contact 670 to the N-type diffusion well 650. The N-type diffusion contact 670 provides the contact path to the biasing voltage to channel the photoelectrons away from the storage node.

Figures 1, 7G:
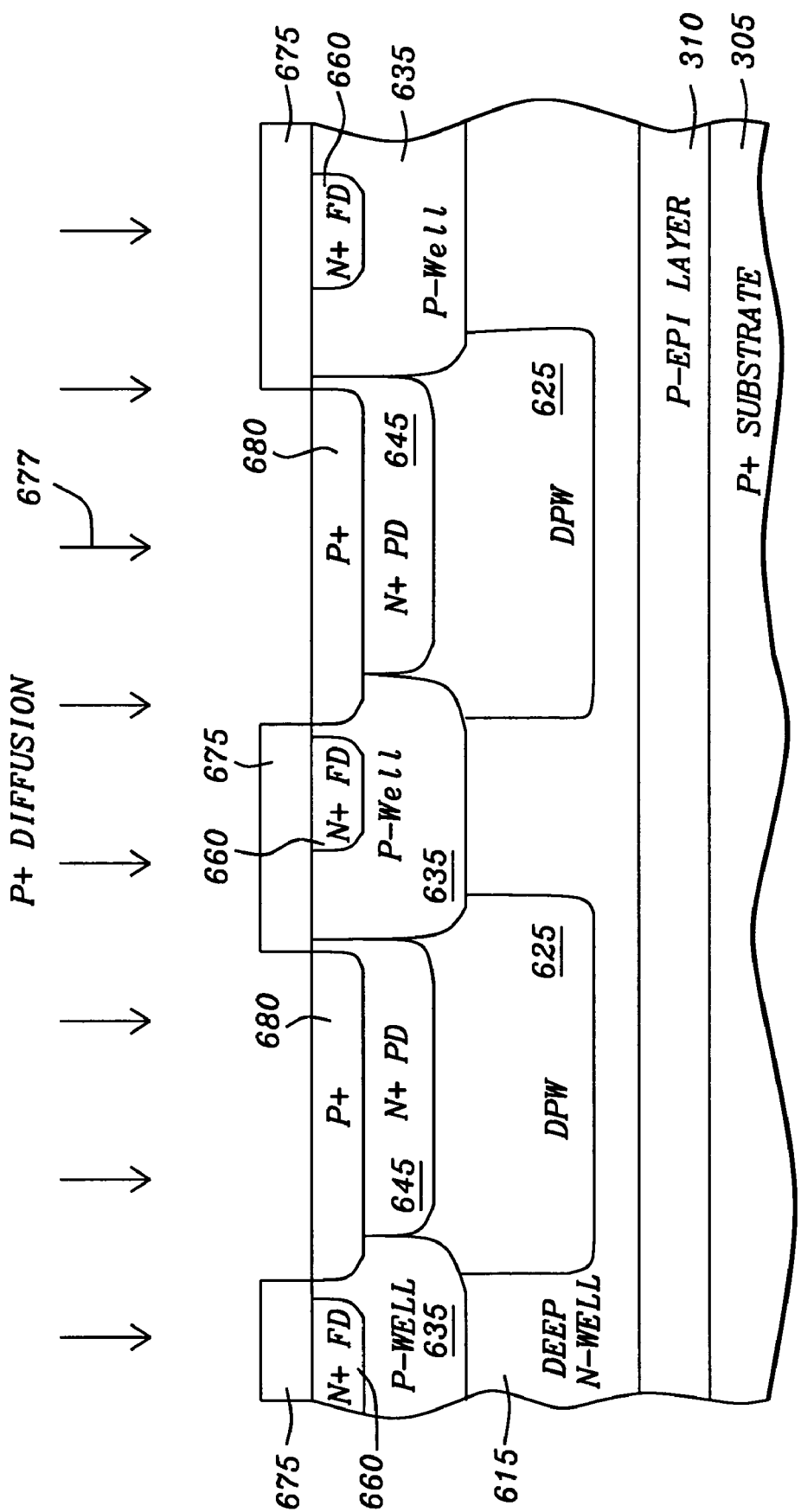
Figures 2, 7G:
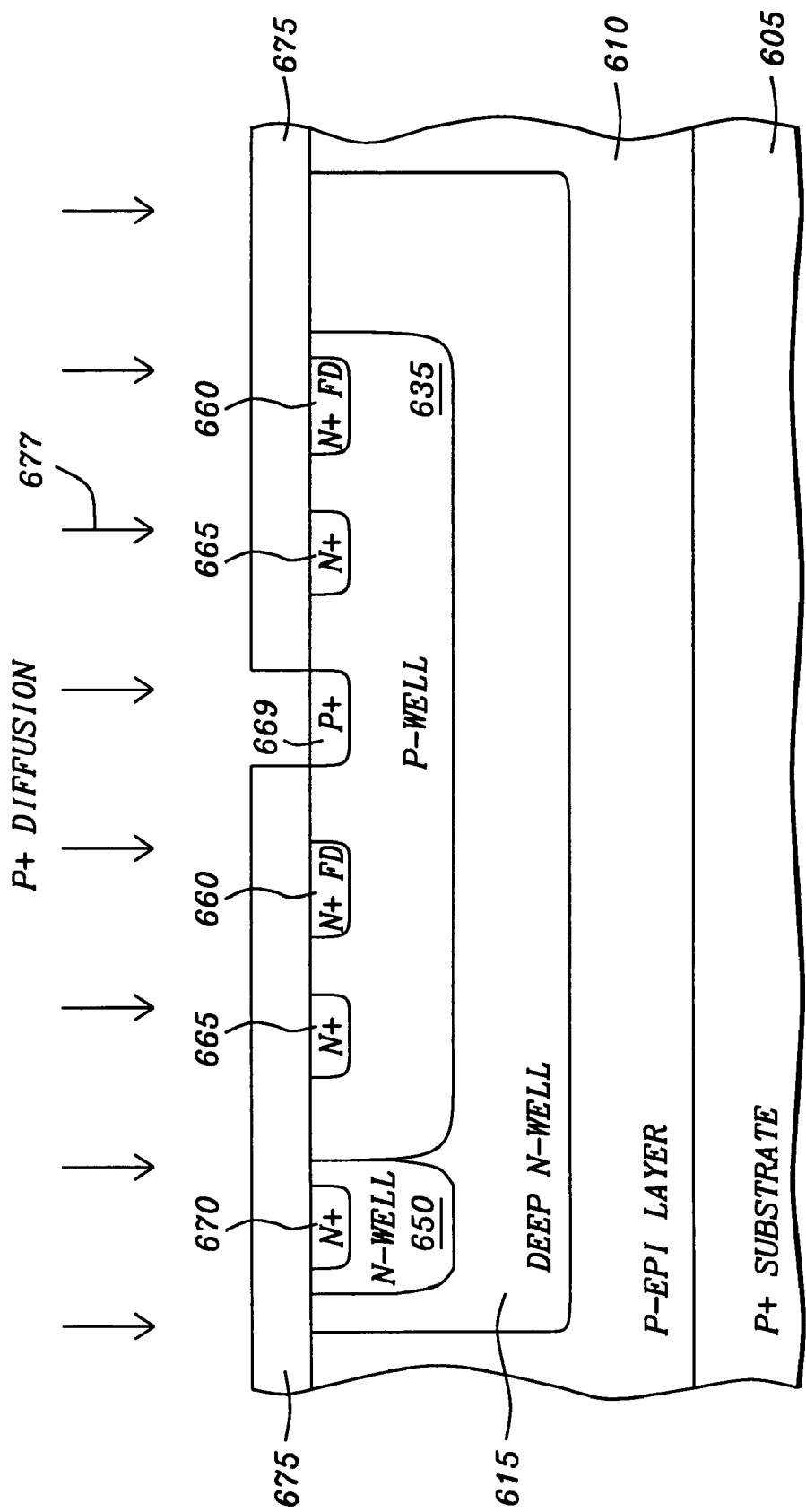

In FIGS. 7g-1 and 7g-2, the photo mask 675 is placed on the surface of the substrate 600 with openings to accept the diffusion 677 of the P-type impurity to a highly doped level to form the P-type pinning diffusions 680. The P-type pinning diffusions 680 are shallowly diffused above the $N^+$ photo diode depletion regions 645 and overlap into the P-diffusion wells 635. The P-type pinning diffusions 680 force depletion of the surface of the $N^+$ photo diode depletion regions 645 in forming the pinned photodiodes of the image sensors. The P-type pinning diffusions 680 assist in the depletion of the $N^+$ photo diode depletion regions 645, but the complete depletion of the $N^+$ photo diode depletion regions 645 is mostly determined by the overall doping profile both at the top and bottom. The P-type diffusion 677 is further diffused to form the $P^+$-contact 669. The photo mask 645 is removed and as shown in FIGS. 7h-1 and 7h-2, a gate insulation or thin oxide 685 is grown on the surface of the substrate 600 and removed in the gate regions that will form the transfer and reset switches of the pixel image sensor. A polycrystalline silicon layer is then grown on the surface of the substrate 600 and doped to with an N-type impurity during deposition to lower its resistance. The polycrystalline silicon is patterned using a photo mask to form the, the transfer gate 690 of the transfer gate switch, and the reset gate 695 of the reset gate switch, as shown in FIGS. 7i-1 and 7i-2.

Figures 1, 7J:
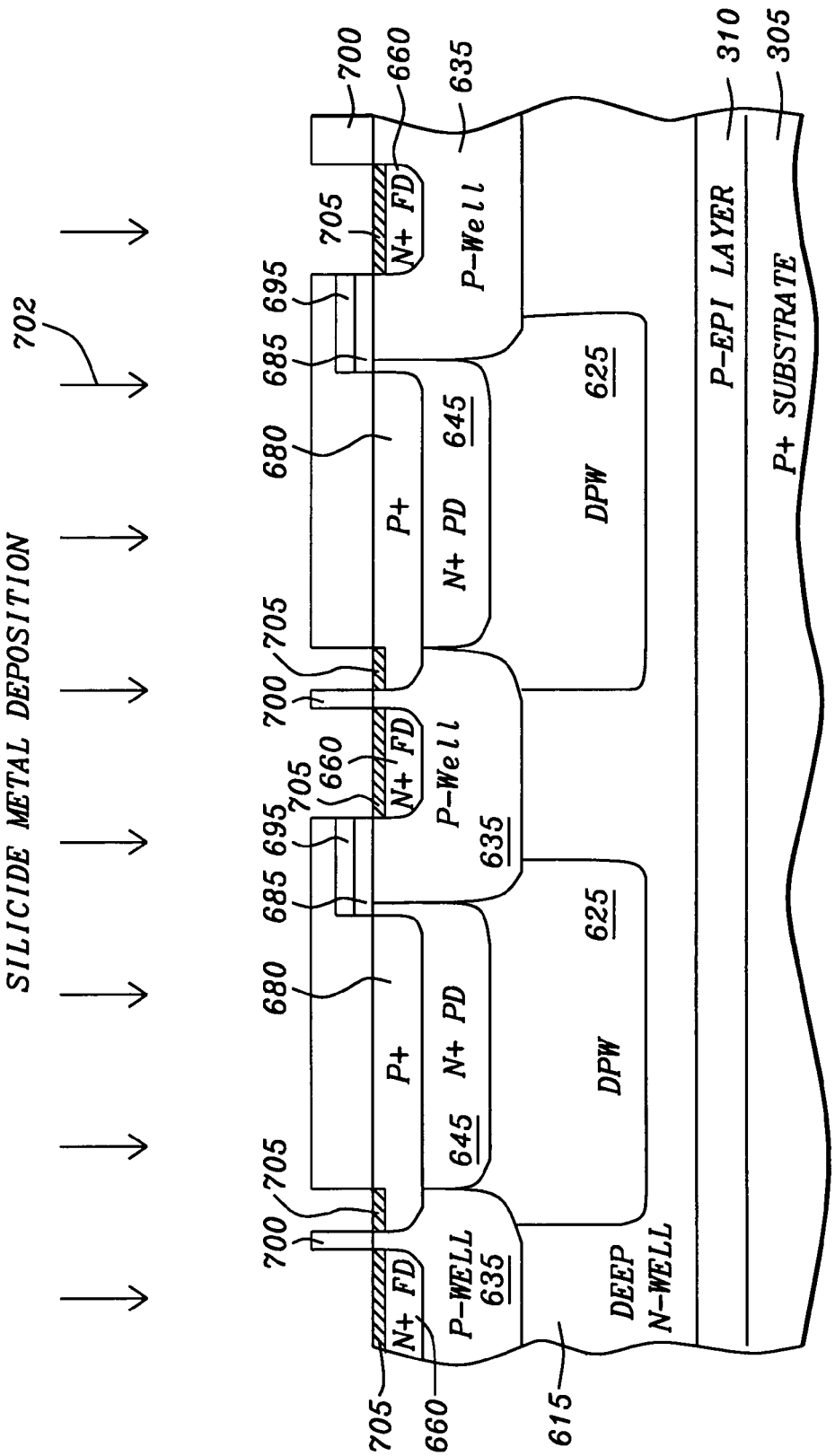
Figures 2, 7J:
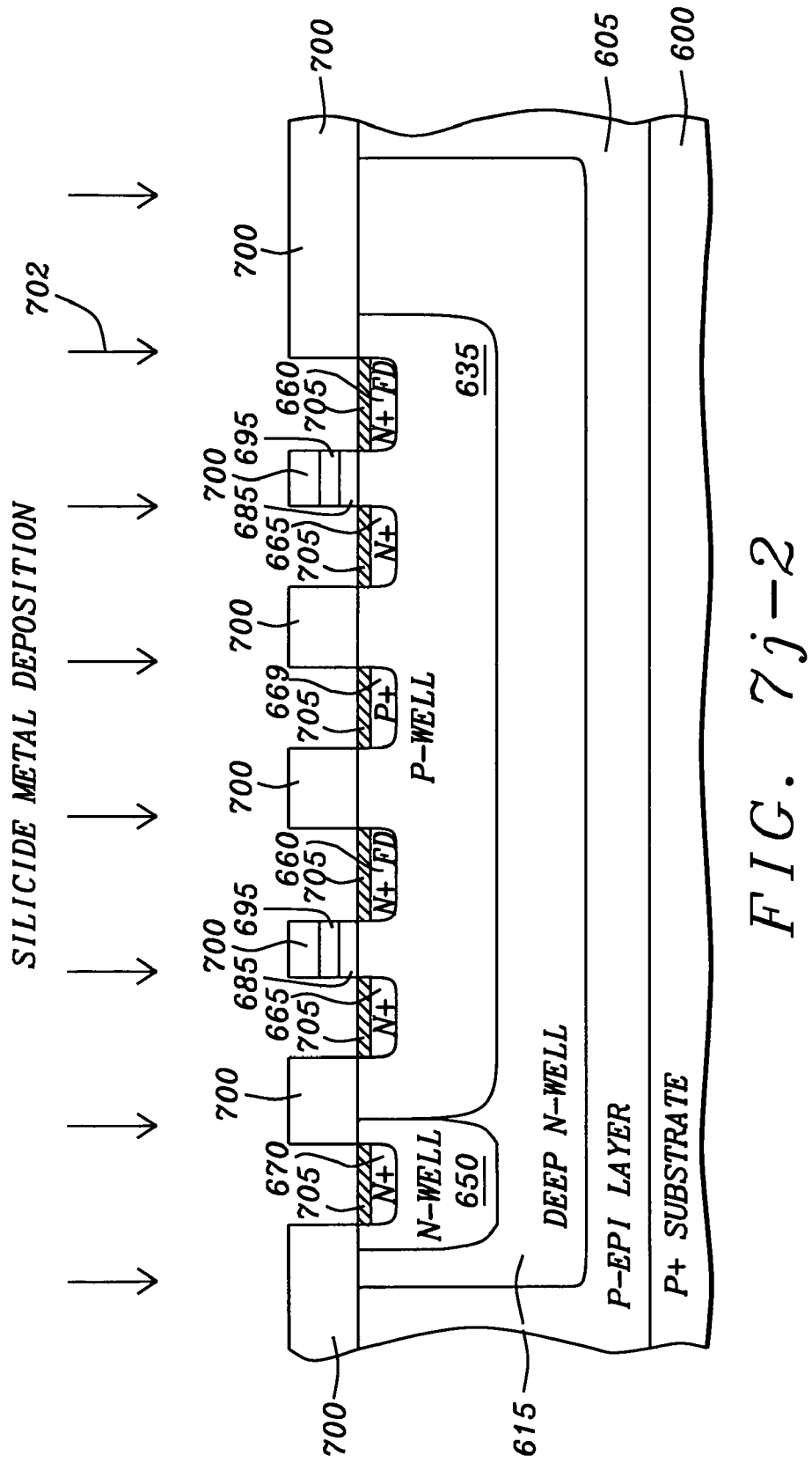

The photo mask 700 is optionally applied, as shown in FIGS. 7j-1 and 7j-2 to the surface of the substrate 600 and openings are made for the $P+$-contact 669, $N+$ contact diffusion 670, the $N+$ source/drains 665 of the reset gate switch, and the floating diffusion storage node 660. Silicide metal 702 is optionally deposited on the surface of the substrate in the openings of the photo mask 700 to form the metallic silicide 705. As is known, the metallic silicide 705 is opaque and maybe used to prevent the photons from impinging upon the transfer gate switches and the reset gate switches and the floating diffusion storage node 660.

Figure 7K:
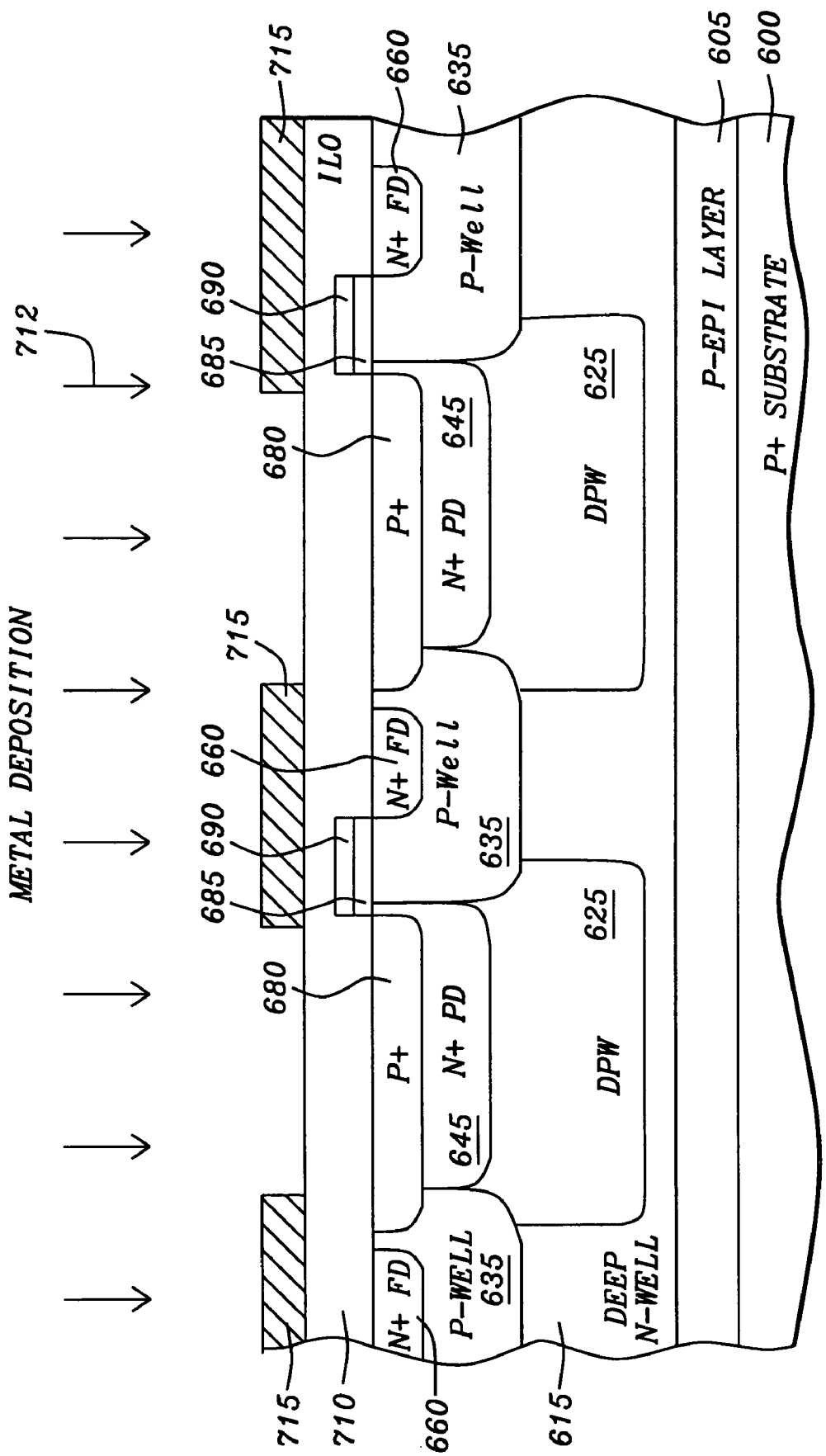

As shown in FIG. 7k, appropriate interconnection insulation layers 710 are deposited on the surface of the substrate. The insulation layers 725 are etched to form contact openings for vias. Conductive metals or polycrystalline silicon are formed to the create the necessary interconnections for the snapshot CMOS active pixel image sensor of this invention as illustrated in FIGS. 5a, 5b, and 5c. These steps of the process are structured as known in the art and are not shown.

The highest layer of metal 712 is deposited on the surface of the substrate 600. A photo mask (not shown) is placed over the area of the substrate that includes the transfer gate switch and the reset gate switch, and the storage node floating diffusion 660. The excess metal is removed and the metal shield 715 is formed over the transfer gate switch and the reset gate switch, and the storage node floating diffusion 660. The structure of the metal shield 715 prevents light from impinging upon the transfer gate switch and the reset gate switch, and the storage node floating diffusion 660 and causing photoelectrons from collecting in the storage node floating diffusion 660. This increases the shutter rejection ratio of the snapshot photogate CMOS active pixel image sensors of this invention. While the metal shield 715 is shown as a discrete upper layer metal structure, as describe, it alternately may be the interconnecting wiring, interlayer vias, and substrate contact metallurgy placed above the transfer gate switch and the reset gate switch, and the storage node floating diffusion 660. The interconnecting wiring, interlayer vias, and substrate contact metallurgy fulfill the function of the separate metal shield 715.

The pinned photodiode active pixel sensor of this invention is suitable for typical consumer applications with high quantum efficiency at visible wavelengths. This is opposed to a photogate active pixels sensor where the blue light is absorbed by the polycrystalline of the photogate. Further, the pinned photodiode active pixel sensor of this invention maybe fabricated with very small dimensions down to approximately 2 µm on each dimension. The deep N-well isolation barrier formed underneath the floating diffusion storage node allows effective isolation by draining away the stray carriers and preventing them from reaching the floating diffusion storage node. The deep P-well conduction well in combination with the deep N-well isolation barrier separates the pinned photodiode region from the deep N-well isolation barrier that is underneath the floating diffusion storage node.

While this invention has been particularly shown and described with reference to the preferred embodiments thereof, it will be understood by those skilled in the art that various changes in form and details may be made without departing from the spirit and scope of the invention.

The invention claimed is:

1. A pixel image sensor fabricated on a substrate having a high shutter rejection ratio comprising:
    an isolation barrier placed at a relatively great depth from a surface of said substrate and beneath a storage node and storage node control transistor switches of said pixel image sensor to prevent substrate charge leakage caused by photoelectrons generated in said substrate beneath a photon sensing area of said pixel image sensor from drifting to said storage node;
    a diffusion well placed in contact with said isolation barrier and connected to a first biasing voltage to channel said photoelectrons away from said storage node; and
    a carrier conduction well placed at said relatively great depth within said isolation barrier to channel said substrate charge leakage to said isolation barrier, said carrier conduction well containing a photo sensing region of said pixel image sensor and connected through said substrate to a second biasing voltage to force said photoelectrons to collect within said photo sensing area.

2. The pixel image sensor of claim 1 further comprising:
    a metal shield fabricated above said storage node and storage node control transistor switches to prevent light from impinging on said storage node and storage node control transistor switches to prevent generation of photoelectrons at said storage node and storage node control transistor switches.

3. The pixel image sensor of claim 2 wherein said metal shield is a combination of interconnecting wiring, interlayer vias, and substrate contact metallurgy placed above said storage node and storage node control transistor switches.

4. The pixel image sensor of claim 1 further comprising:
    a metallic silicide in contact with said storage node and source/drain regions of said storage node control transistor switches, said metallic silicide layer being opaque to prevent light impinging on said storage node and storage node control transistor switches from generation of photoelectrons at said storage node and storage node control transistor switches.

5. The pixel image sensor of claim 1 wherein said first biasing voltage is a power supply voltage source such that said isolation barrier drains said photoelectrons that drift toward said isolation barrier.

6. The pixel image sensor of claim 1 wherein said second biasing voltage is a ground reference voltage source such that said carrier conduction well minimizes said photoelectrons within said carrier conduction well.

7. The pixel image sensor of claim 1 wherein said pixel image sensor is fabricated on an epitaxial layer of said substrate, said epitaxial layer being doped with an impurity of a first conductivity type, said isolation barrier being formed from diffusion of an impurity of a second conductivity type to said relatively great depth and said carrier conduction well being formed from diffusion of an impurity of said first conductivity type.

8. The pixel image sensor of claim 7 further comprising an isolation well fabricated by diffusion of said impurity of said first type to a depth less than said relatively great depth on said isolation barrier and containing said storage node and storage node control transistor switches.

9. The pixel image sensor of claim 1 wherein said photo sensing region of said pixel image sensor is a pinned photodiode.

10. A pixel image sensor integrated circuit fabricated on a substrate comprising:
    an array of pixel image sensors having a high shutter rejection ratio fabricated on said substrate, each pixel image senor comprising:
    an isolation barrier placed at a relatively great depth from a surface of said substrate and beneath a storage node and storage node control transistor switches of said pixel image sensor to prevent substrate charge leakage caused by photoelectrons generated in said substrate beneath a photon sensing area of said pixel image sensor from drifting to said storage node;
    a diffusion well placed in contact with said isolation barrier and connected to a first biasing voltage to channel said photoelectrons away from said storage node; and
    a carrier conduction well placed at said relatively great depth within said isolation barrier to channel said substrate charge leakage to said isolation barrier, said carrier conduction well containing a photo sensing region of said pixel image sensor and connected through said substrate to a second biasing voltage to force said photoelectrons to collect within said photo sensing area.

11. The pixel image sensor integrated circuit of claim 10 wherein each pixel image sensor further comprises:
    a metal shield fabricated above said storage node and storage node control transistor switches to prevent light from impinging on said storage node and storage node control transistor switches to prevent generation of photoelectrons at said storage node and storage node control transistor switches.

12. The pixel image sensor integrated circuit of claim 11 wherein said metal shield is a combination of interconnecting wiring, interlayer vias, and substrate contact metallurgy placed above said storage node and storage node control transistor switches.

13. The pixel image sensor integrated circuit of claim 10 wherein each pixel image sensor further comprises:
    a metallic silicide layer in contact with said storage node and source/drain regions of said storage node control transistor switches, said metallic silicide layer being opaque to prevent light impinging on said storage node and storage node control transistor switches from generation of photoelectrons at said storage node and storage node control transistor switches.

14. The pixel image sensor integrated circuit of claim 10 wherein said first biasing voltage is a power supply voltage source such that said isolation barrier drains said photoelectrons that drift toward said isolation barrier.

15. The pixel image sensor integrated circuit of claim 10 wherein said second biasing voltage is a ground reference voltage source such that said carrier conduction well minimizes said photoelectrons within said carrier conduction well.

16. The pixel image sensor integrated circuit of claim 10 wherein each of said pixel image sensors is fabricated in an epitaxial layer of said substrate, said epitaxial layer being doped with an impurity of a first conductivity type, said isolation barrier being formed from diffusion of an impurity of a second conductivity type to said relatively great depth and said carrier conduction well being formed from diffusion of an impurity of said first conductivity type.

17. The pixel image sensor integrated circuit of claim 16 wherein each pixel image sensor further comprises a isolation well fabricated by diffusion of said impurity of said first type to a depth less than said relatively great depth on said isolation barrier and containing said storage node and storage node control transistor switches.

18. The pixel image sensor integrated circuit of claim 10 wherein said photo sensing region of said pixel image sensor is a pinned photodiode.

19. An image capture system for detecting objects without motion artifacts comprising:
  a pixel image sensor integrated circuit fabricated on a substrate comprising:
    an array of pixel image sensors having a high shutter rejection ratio fabricated on said substrate, each pixel image senor comprising:
      an isolation barrier placed at a relatively great depth from a surface of said substrate and beneath a storage node and storage node control transistor switches of said pixel image sensor to prevent substrate charge leakage caused by photoelectrons generated in said substrate beneath a photon sensing area of said pixel image sensor from drifting to said storage node;
      a diffusion well placed in contact with said isolation barrier and connected to a first biasing voltage to channel said photoelectrons away from said storage node; and
      a carrier conduction well placed at said relatively great depth within said isolation barrier to channel said substrate charge leakage to said isolation barrier, said carrier conduction well containing a photo sensing region of said pixel image sensor and connected through said substrate to a second biasing voltage to force said photoelectrons to collect within said photo sensing area.

20. The image capture system of claim 19 wherein each pixel image sensor further comprises:
  a metal shield fabricated above said storage node and storage node control transistor switches to prevent light from impinging on said storage node and storage node control transistor switches to prevent generation of photoelectrons at said storage node and storage node control transistor switches.

21. The image capture system of claim 20 wherein said metal shield is a combination of interconnecting wiring, inter-layer vias, and substrate contact metallurgy placed above said storage node and storage node control transistor switches.

22. The image capture system of claim 19 wherein each pixel image sensor further comprises:
  a metallic silicide layer in contact with said storage node and source/drain regions of said storage node control transistor switches, said metallic silicide layer being opaque to prevent light impinging on said storage node and storage node control transistor switches from generation of photoelectrons at said storage node and storage node control transistor switches.

23. The image capture system of claim 19 wherein said first biasing voltage is a power supply voltage source such that said isolation barrier drains said photoelectrons that drift toward said isolation barrier.

24. The image capture system of claim 19 wherein said second biasing voltage is a ground reference voltage source such that said carrier conduction well minimizes said photoelectrons within said carrier conduction well.

25. The image capture system of claim 19 wherein each of said pixel image sensors is fabricated in an epitaxial layer of said substrate, said epitaxial layer being doped with an impurity of a first conductivity type, said isolation barrier being formed from diffusion of an impurity of a second conductivity type to said relatively great depth and said carrier conduction well being formed from diffusion of an impurity of said first conductivity type.

26. The image capture system of claim 25 wherein each pixel image sensor further comprises a isolation well fabricated by diffusion of said impurity of said first type to a depth less than said relatively great depth on said isolation barrier and containing said storage node and storage node control transistor switches.

27. The image capture system of claim 19 wherein said photo sensing region of said pixel image sensor is a pinned photodiode.

* * * * *